United States Patent
Pinhasi et al.

(10) Patent No.: US 11,079,422 B2
(45) Date of Patent: Aug. 3, 2021

(54) FAULT LOCATION IN A TRANSMISSION LINE

(71) Applicant: Ariel Scientific Innovations Ltd., Ariel (IL)

(72) Inventors: Yosef Pinhasi, Tel-Aviv (IL); Asher Yahalom, Givat Shmuel (IL)

(73) Assignee: Ariel Scientific Innovations Ltd., Ariel (IL)

( * ) Notice: Subject to any disclaimer, the term of this patent is extended or adjusted under 35 U.S.C. 154(b) by 293 days.

(21) Appl. No.: 16/082,322

(22) PCT Filed: Mar. 17, 2017

(86) PCT No.: PCT/IL2017/050337
§ 371 (c)(1),
(2) Date: Sep. 5, 2018

(87) PCT Pub. No.: WO2017/158608
PCT Pub. Date: Sep. 21, 2017

(65) Prior Publication Data
US 2019/0079131 A1    Mar. 14, 2019

Related U.S. Application Data

(60) Provisional application No. 62/309,550, filed on Mar. 17, 2016.

(51) Int. Cl.
*G01R 31/08* (2020.01)
*H04B 3/46* (2015.01)
*G01R 31/11* (2006.01)

(52) U.S. Cl.
CPC ......... *G01R 31/088* (2013.01); *G01R 31/085* (2013.01); *H04B 3/46* (2013.01); *G01R 31/11* (2013.01)

(58) Field of Classification Search
CPC ......... H04L 1/00; H04L 2201/00; G05B 1/00; G05B 2219/00; H04B 1/00
See application file for complete search history.

(56) References Cited

U.S. PATENT DOCUMENTS

| 4,321,681 A | 3/1982 | Sackin et al. |
| 4,766,549 A | 8/1988 | Schweitzer, III et al. |

(Continued)

FOREIGN PATENT DOCUMENTS

| WO | WO 2013/127438 | 9/2013 |
| WO | WO 2017/158608 | 9/2017 |

OTHER PUBLICATIONS

International Preliminary Report on Patentability dated Sep. 27, 2018 From the International Bureau of WIPO Re. Application No. PCT/IL2017/050337. (5 Pages).

(Continued)

*Primary Examiner* — Jermele M Hollington
*Assistant Examiner* — Temilade S Rhodes-Vivour

(57) ABSTRACT

System and method for locating a fault on a line comprises a sampler that samples a pulse from the fault, the sampling being carried out at a predetermined sampling rate. A differentiator produces a differential or derivative of the pulse, and an analyzer obtains timing information from the derivative, from which it is possible to locate the fault knowing the total length of the line and the wave propagation rate.

23 Claims, 19 Drawing Sheets

(56) References Cited

U.S. PATENT DOCUMENTS

| | | | |
|---|---|---|---|
| 6,519,739 B1* | 2/2003 | Sandorfi | H04L 1/00 |
| | | | 324/512 |
| 2003/0016044 A1* | 1/2003 | Ishida | G01R 31/3181 |
| | | | 324/762.02 |
| 2005/0001607 A1* | 1/2005 | Berland | G01R 31/67 |
| | | | 324/67 |
| 2005/0201488 A1* | 9/2005 | Duff | H04L 25/4908 |
| | | | 375/316 |
| 2008/0158753 A1 | 7/2008 | Premerlani et al. | |
| 2012/0086459 A1 | 4/2012 | Kim | |
| 2013/0304406 A1 | 11/2013 | Kim | |
| 2015/0081235 A1* | 3/2015 | Schweitzer, III | H02H 7/265 |
| | | | 702/59 |
| 2017/0199237 A1* | 7/2017 | Dzienis | H02H 3/30 |

OTHER PUBLICATIONS

International Search Report and the Written Opinion dated Jun. 25, 2017 From the International Searching Authority Re. Application No. PCT/IL2017/050337. (10 Pages).

* cited by examiner

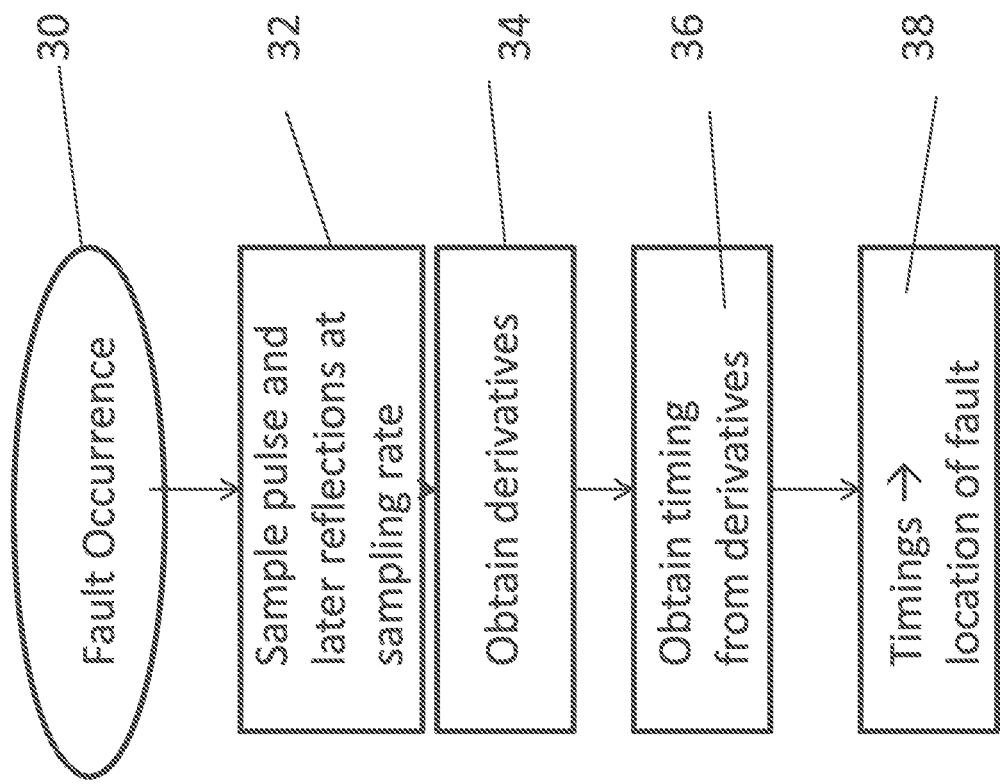

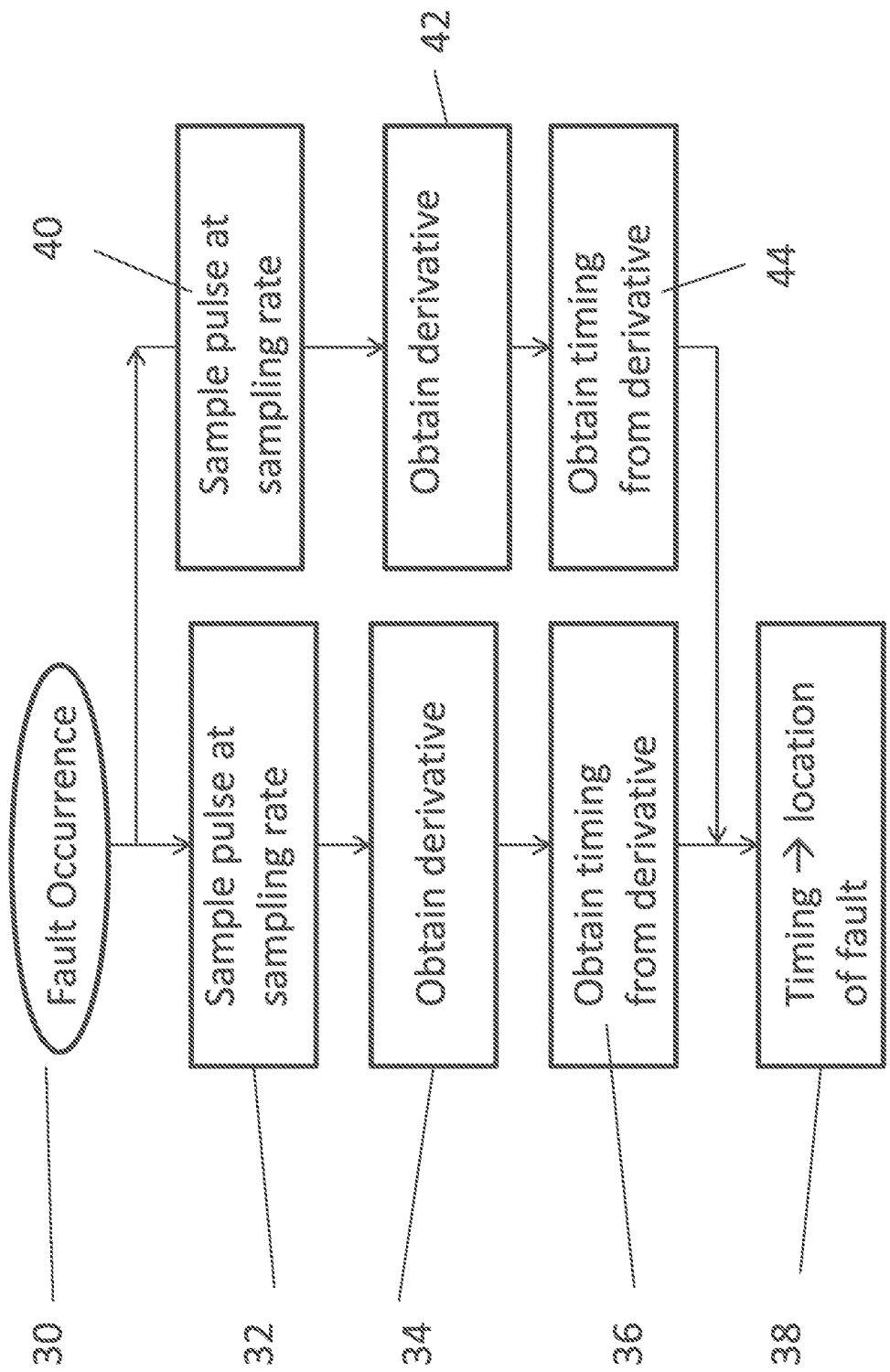

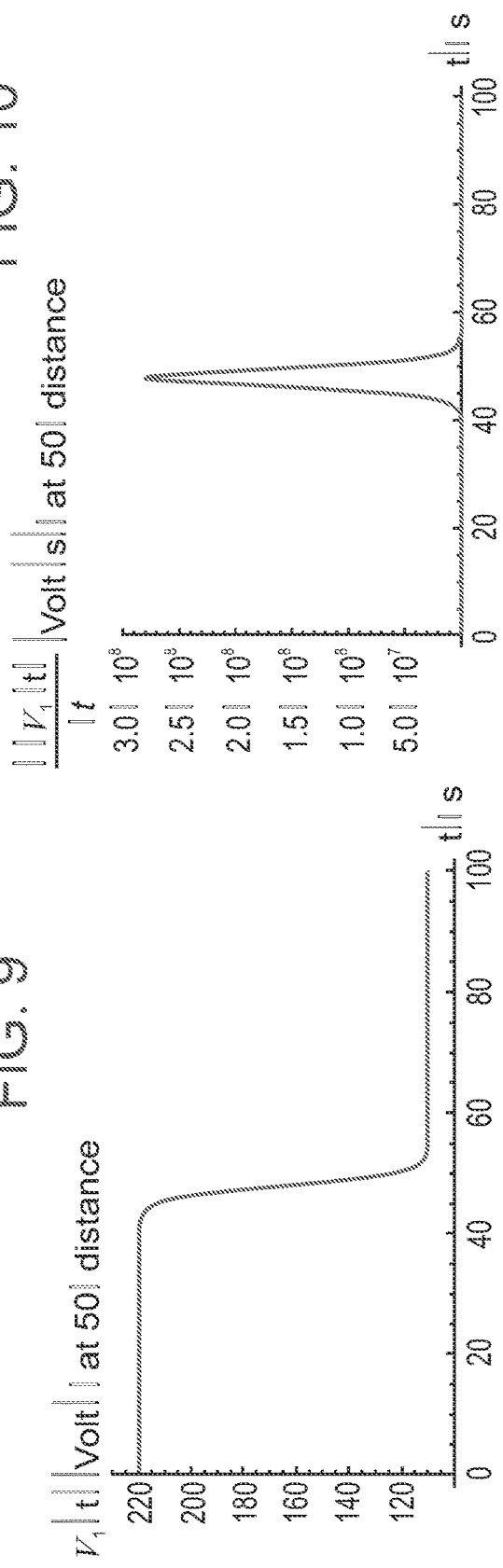
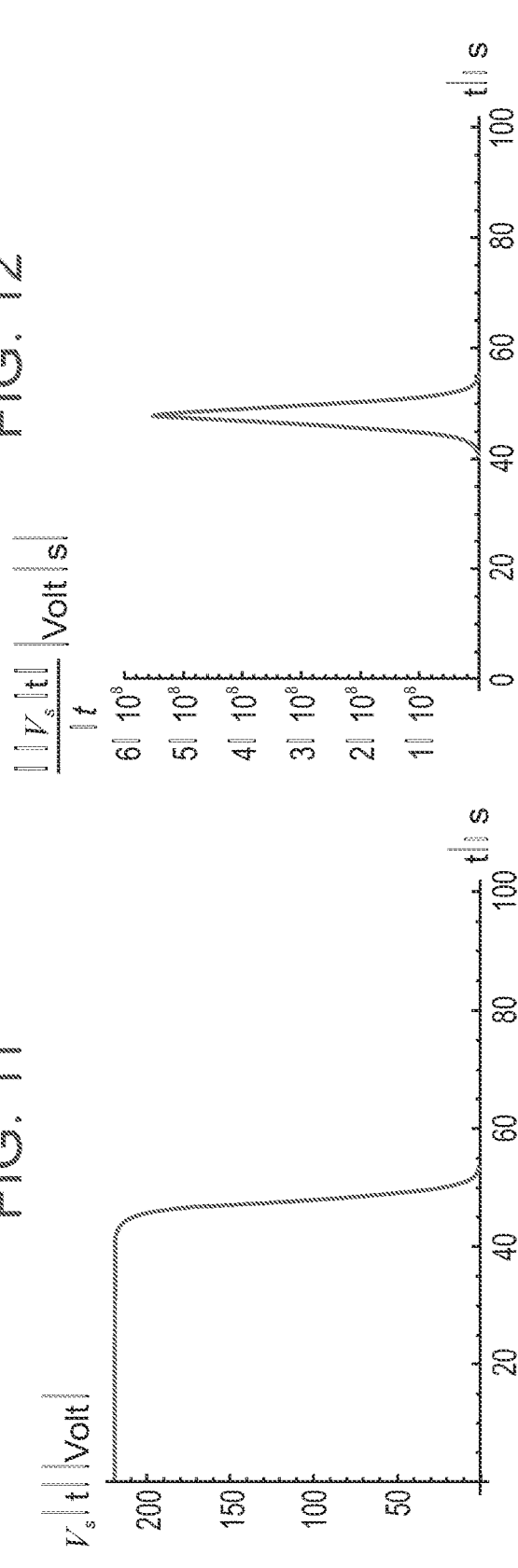
FIG. 9
FIG. 10
FIG. 11
FIG. 12

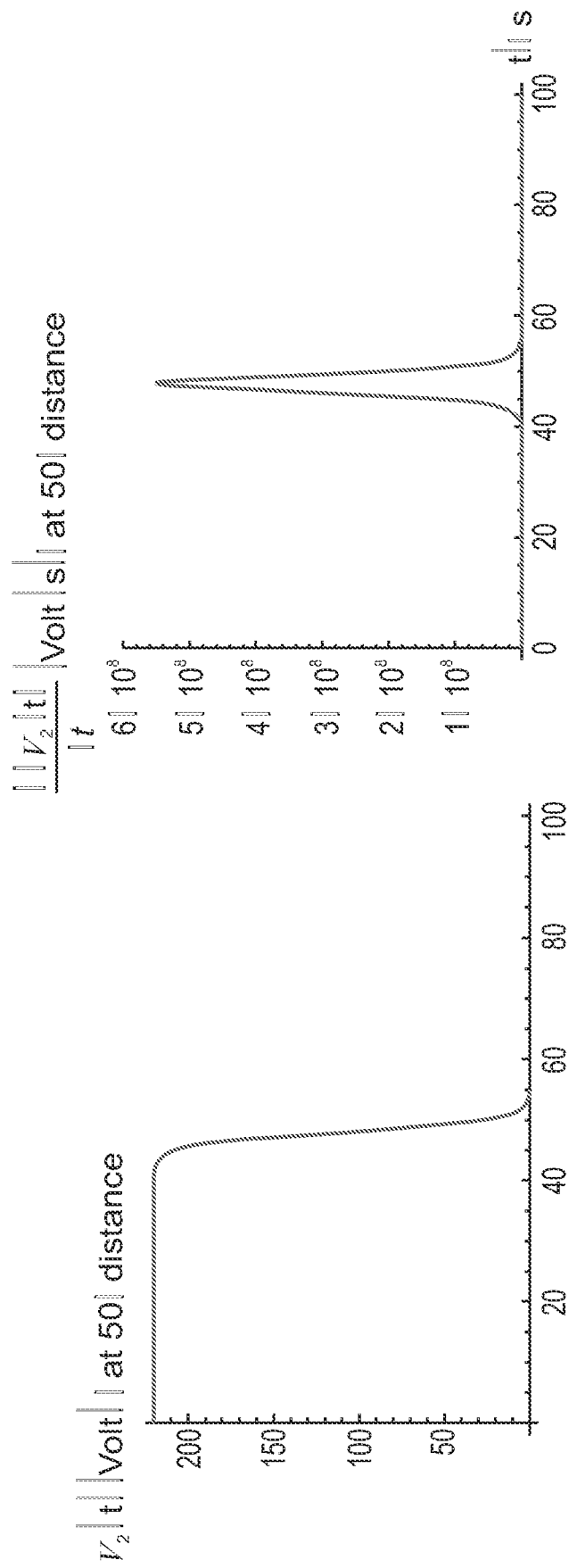

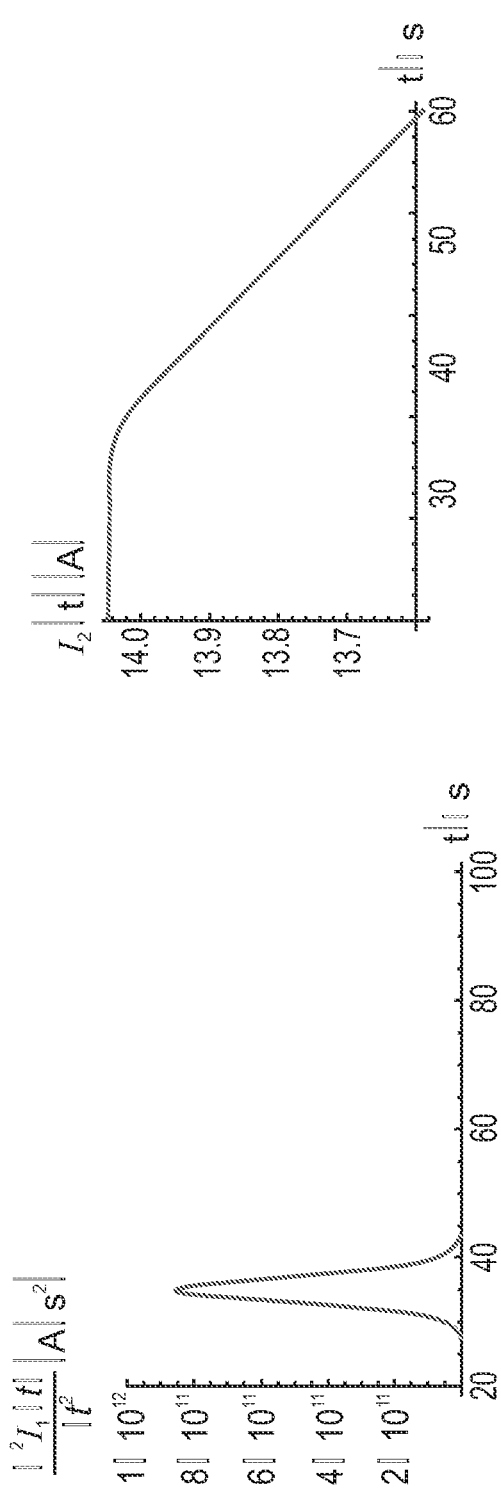
FIG. 19
FIG. 20
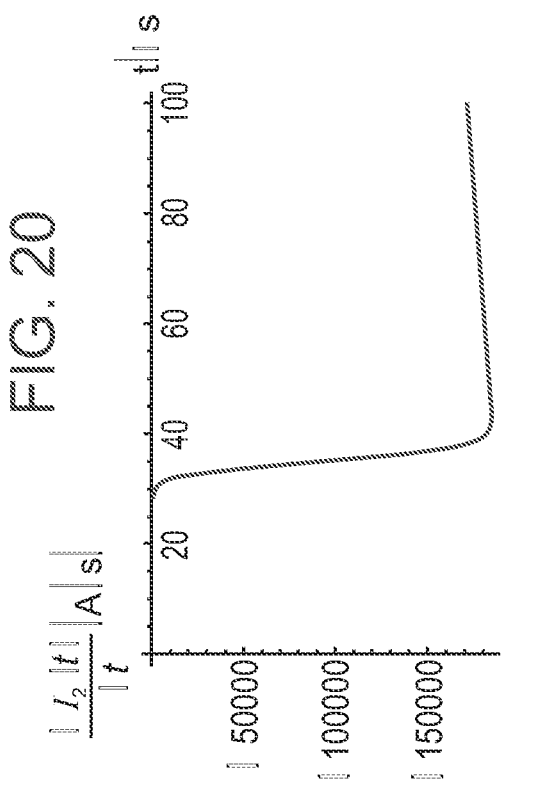
FIG. 21
FIG. 22

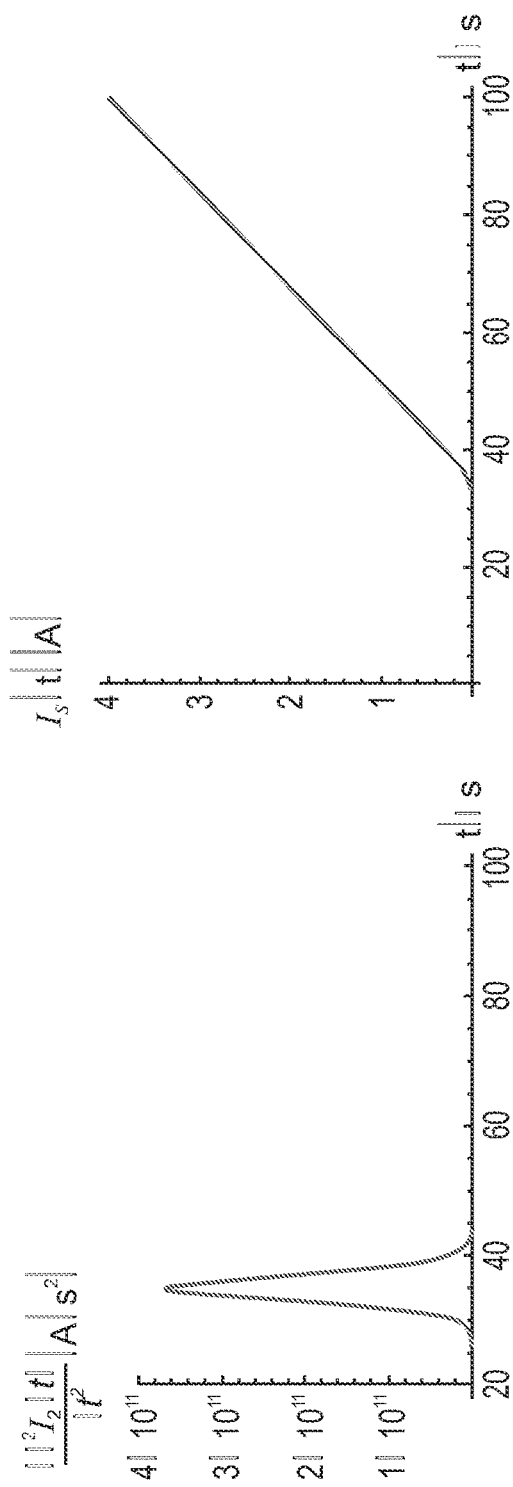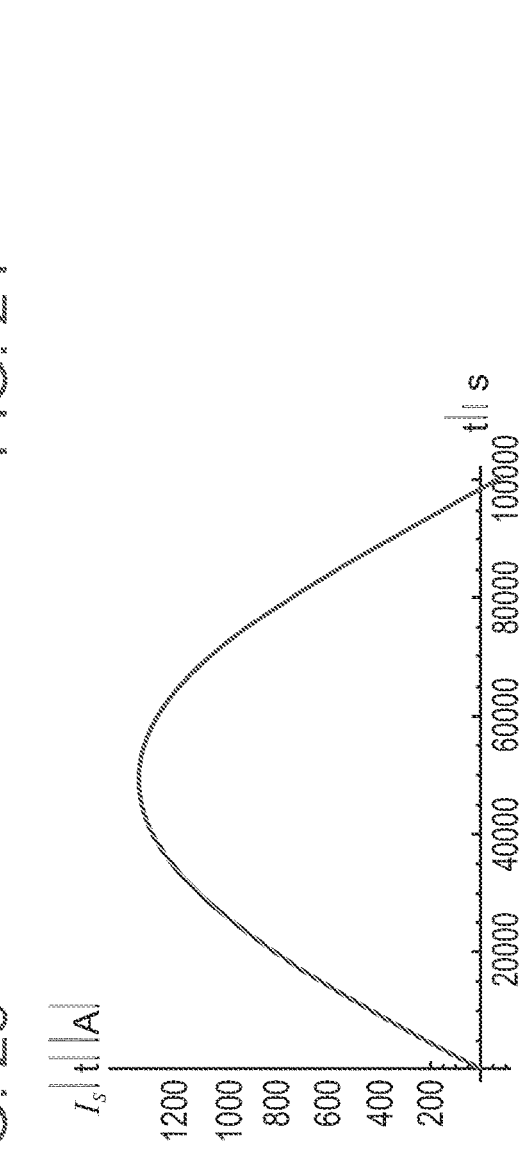
FIG. 23
FIG. 24
FIG. 25

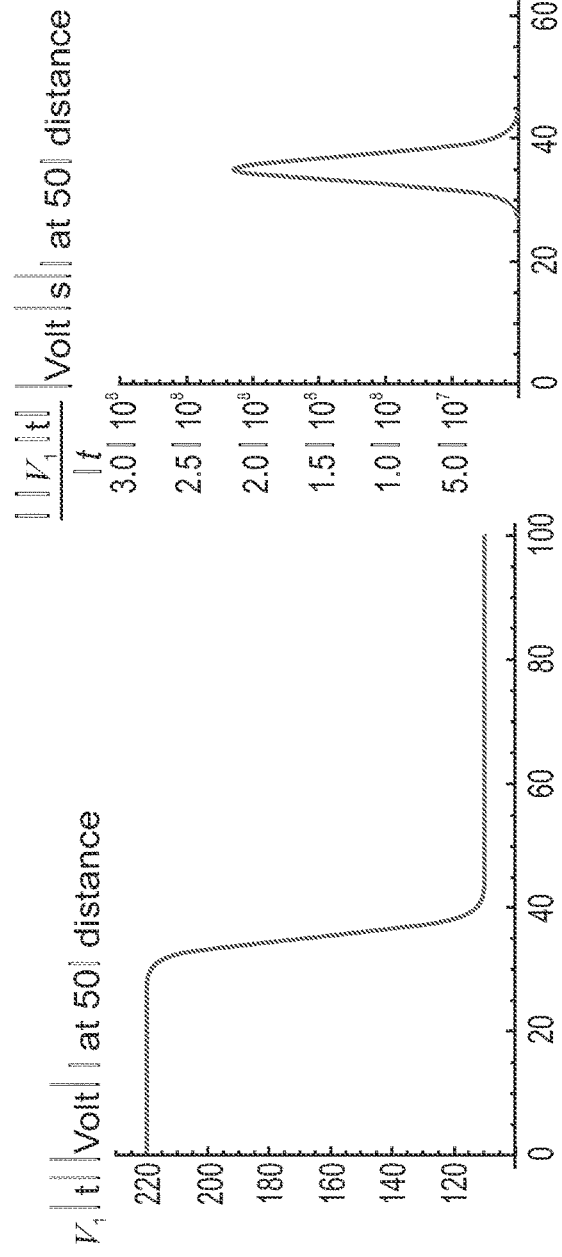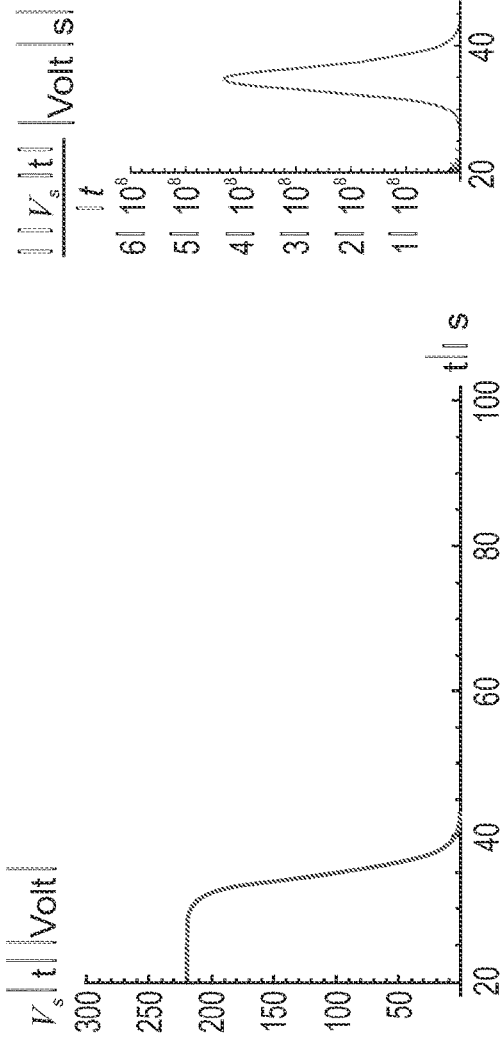
FIG. 26  FIG. 27  FIG. 28  FIG. 29

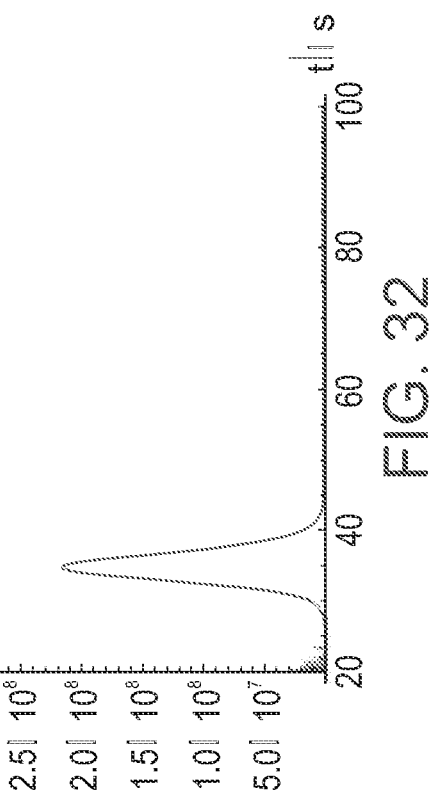
FIG. 30
FIG. 31
FIG. 32

FAULT LOCATION IN A TRANSMISSION LINE

RELATED APPLICATIONS

This application is a National Phase of PCT Patent Application No. PCT/IL2017/050337 having International filing date of Mar. 17, 2017, which claims the benefit of priority under 35 USC § 119(e) of U.S. Provisional Patent Application No. 62/309,550 filed on Mar. 17, 2016. The contents of the above applications are all incorporated by reference as if fully set forth herein in their entirety.

FIELD AND BACKGROUND OF THE INVENTION

The present invention, in some embodiments thereof, relates to fault location in real time in a line and, more particularly, but not exclusively, to a method and apparatus that uses signal propagation properties to find the location of the fault. The fault may be for example a short circuit in a high voltage transmission line, or a break in an optical cable or a leak in a pipe distribution system, for example for oil, gas or water.

During a short circuit, a signal is propagated due to the short and reaches both ends of the line. Although most of the embodiments described herein are described in relation to electrical transmission lines involving electromagnetic waves travelling in copper or aluminum wires, the same applies to fiber-optic lines and to microwaves in waveguides and indeed to acoustic waves in waveguides.

In the short circuit case the voltage at the fault position is zero since there can be no voltage across a short circuit. As the reflection travels back up the line as a travelling wave, it is known to use the travelling wave to help locate the fault, and in the case of underground cables, travelling wave methods may be the only methods available.

The travelling wave methods require high sampling rates in order to obtain accurate results and fault location and it is often difficult to distinguish the reflection from the fault on the one hand from the reflection from the far end of the transmission cable on the other hand. The methods used typically require current or voltage detectors to be placed at either end of the line. A pulse or reflection is detected and time stamped at either end, preferably using an accurate positioning locator like GPS system to give a time stamp which is accurate for both ends of the line. The accuracy is in the order of hundreds of meters, which is not terribly useful in determining where to uncover an underground cable.

SUMMARY OF THE INVENTION

The location of the short circuit fault can be determined by obtaining timing information, not from the reflection or the pulse itself, but from a first or second derivative of such a reflection or from the pulse. A voltage or a current may be sampled to obtain the derivative and sampling may be in the gigahertz range and may give a range of accuracy in the tens of centimeters.

According to an aspect of some embodiments of the present invention there is provided a system for locating a fault on a line, the line having a first end and a second end and a first direction being from said first end to said second end, the system comprising:

a first sampler configured to sample a pulse, the pulse emanating from a fault in a second direction opposite said first direction, the sampling being at a predetermined sampling rate;
a differentiator configured to produce a differential of said sampled pulse;
an analyzer configured to analyze said differential to obtain a timing, therefrom to determine a location of said fault.

The system may comprise a second sampler at said second end, configured to sample said pulse at said second end.

The system may be configured to find a location of said fault as a proportion based on half of a time taken by said pulse to arrive at said first sampler compared with a time taken by the pulse to arrive at said second sampler.

In an embodiment, said predetermined sampling rate is in the gigahertz range.

In an embodiment, a distance from said first end to said second end, d, is known, a distance d1 from said first end to a fault is unknown and a distance from said fault to said second end, being d2=d−d1, is also unknown, a time of arrival of said pulse is t1, a time of arrival of said pulse at said second end is t2, and a propagation velocity of said pulse over said line v is known, the analyzer being configured to calculate $\Delta t = t2 - t1$ and $d_1 \frac{1}{2}(d - v\Delta t)$ thereby to locate said fault.

In an embodiment, a distance from said first end to said second end, d, is known, a distance d1 from said first end to a fault is unknown and a distance from said fault to said second end, being d2=d−d1, is also unknown, a time of arrival of said pulse is t1 relating to distance d1, a time of arrival of an echo of said pulse from said second end is t2 relating to a distance (d1+2d2), and a propagation velocity of said pulse over said line v is known, the analyzer being configured to locate said fault.

In an embodiment, a distance from said first end to said second end, d, is known, said fault being at said first end, a distance d1 from said fault at said first end to said sensor is unknown, a distance d2 from said sensor to said second end is known, a time of arrival of said pulse is t1 relating to distance d1, a time of arrival of a first echo of said pulse from said fault is t2 relating to a distance (d1+2d2), and a propagation velocity of said pulse over said line v is known, the analyzer being configured to locate said fault.

In an embodiment, said predetermined sampling rate is 2/v.

In an embodiment, the line is an electrical transmission line and the fault comprises a short circuit.

In an embodiment, said first sampler is configured to sample current.

In an embodiment, said first sampler is configured to sample voltage.

In an embodiment, the line is a transverse electromagnetic wave (TEM) transmission line.

In an embodiment, the line is an optical line and the fault is a break in the optical line.

In an embodiment, the line is a pipe, said pulse is an acoustic pulse and said fault is a break in the pipe.

In an embodiment, said first sampler is configured to obtain a plurality of successive samples.

In an embodiment, said plurality of successive samples are placed in a fixed size buffer with oldest samples being deleted to make way for new samples.

According to a second aspect of the present invention there is provided a control center, comprising links to a plurality of sources and a plurality of samplers on a plurality of lines.

According to a third aspect of the present invention there is provided a method for locating a fault on a line, the line having a first end and a second end and a first direction being from said first end to said second end, the method comprising:

sampling a pulse, in a second direction opposite said first direction, the pulse issuing from said fault, the sampling being at a predetermined sampling rate;

obtaining a differential of said sampled pulse;

analyzing said differential to obtain a timing, therefrom to determine a location of said fault.

The method may comprise sampling said pulse at said second end.

The method may comprise finding a location of said fault as a proportion based on half of a time taken by said pulse to arrive at said first end compared with a time taken by the pulse to arrive at said second end.

In an embodiment, said predetermined sampling rate is in the gigahertz range.

In the method, a distance from said first end to said second end, d, is known, a distance d1 from said first end to a fault is unknown, a distance from said fault to said second end is d−d1 and also is unknown, a time of arrival of said reflection is t1, a time of arrival at said pulse at said second end is t2, and a propagation velocity of said pulse over said line, v, is known, the analyzer being configured to calculate Δt=t2−t1 and $d_1$ 1½(d−vΔt) thereby to locate said fault.

Alternatively, in the method, a distance from said first end to said second end, d, is known, a distance d1 from said first end to a fault is unknown and a distance from said fault to said second end, being d2=d−d1, is also unknown, a time of arrival of said pulse is t1 relating to distance d1, a time of arrival of an echo of said pulse from said second end is t2 relating to a distance (d1+2d2), and a propagation velocity of said pulse over said line v is known, the method thereby locating said fault.

In the method, a distance from said first end to said second end, d, is known, a distance d1 from a fault at said first end to said sensor is unknown, and a distance d2 from said sensor to said second end is known, a time of arrival of said pulse is t1 relating to distance d1, a time of arrival of a first echo of said pulse from said fault is t2 relating to a distance (d1+2d2), and a propagation velocity of said pulse over said line v is known, the method thereby locating said fault.

In the method, said predetermined sampling rate may be 2/v.

In the method, the line may be an electrical transmission line and the fault comprises a short circuit.

The method may comprise sampling current.

The method may comprise sampling voltage.

In the method, the line may be an optical line and the fault is a break in the optical line.

In the method, the line may be a pipe, said pulse may be an acoustic pulse and said fault may be a break in the pipe.

The method may comprise placing a plurality of successive samples in a fixed size buffer with oldest samples being deleted to make way for new samples.

The method may comprise controlling a plurality of lines from a control center, by sending pulses and sampling on any of said lines where a fault needs to be identified.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 2A is a flow chart showing operation of the embodiment of FIG. 1B;

FIG. 2B is a flow chart showing operation of the embodiment of FIG. 1C;

FIG. 9 is a simplified graph schematically showing the voltage at half the distance between the source and the failure, as may be obtained by sampling according to the present embodiments.

FIG. 10 schematically shows the derivative obtained by the present embodiments from the voltage graph of FIG. 9;

FIG. 11 schematically illustrates voltage at the fault as may be obtained by sampling according to the present embodiments;

FIG. 12 schematically illustrates the derivative obtained according to the present embodiments from the voltage of FIG. 11;

FIG. 13 schematically illustrates voltage at half the distance between the fault and the load, as may be obtained by sampling according to the present embodiments;

FIG. 14 schematically illustrates the derivative obtained according to the present embodiments from the voltage of FIG. 13;

FIG. 19 schematically illustrates the second derivative of the source current of FIG. 17 as may be obtained using the present embodiments;

FIG. 20 schematically illustrates load current directly after occurrence of the fault, as may be obtained by sampling according to the present embodiments;

FIG. 21 schematically illustrates load current a significant time after occurrence of the fault, as may be obtained by sampling according to the present embodiments;

FIG. 22 schematically illustrates the first derivative of the load current as may be obtained using the present embodiments;

FIG. 23 schematically illustrates the second derivative of the load current as may be obtained using the present embodiments;

FIG. 24 schematically illustrates short circuit current directly after occurrence of the fault, as may be obtained by sampling according to the present embodiments;

FIG. 25 schematically illustrates steady state short circuit current as may be obtained by sampling according to the present embodiments;

FIG. 26 schematically illustrates voltage at half the distance between the source and the short, as may be obtained by sampling according to the present embodiments;

FIG. 27 schematically illustrates the derivative of the voltage of FIG. 26 as obtained using embodiments of the present invention;

FIG. 28 schematically illustrates voltage at the short circuit fault itself as the resistance at the fault falls to zero, the voltage as may be obtained by sampling according to the present embodiments;

FIG. 29 schematically illustrates the derivative of the voltage of FIG. 28 as obtained using the present embodiments;

FIG. 30 schematically illustrates voltage at half the distance between the load and the fault as may be obtained by sampling according to the present embodiments directly after occurrence of the fault;

FIG. 31 schematically illustrates the voltage at half the distance between the load and the fault as may be obtained by sampling according to the present embodiments when steady state conditions have been reached after occurrence of the fault;

FIG. 32 schematically illustrates the derivative of the voltage of FIG. 31 as may be obtained using the present embodiments;

DESCRIPTION OF SPECIFIC EMBODIMENTS OF THE INVENTION

Figure 1A:
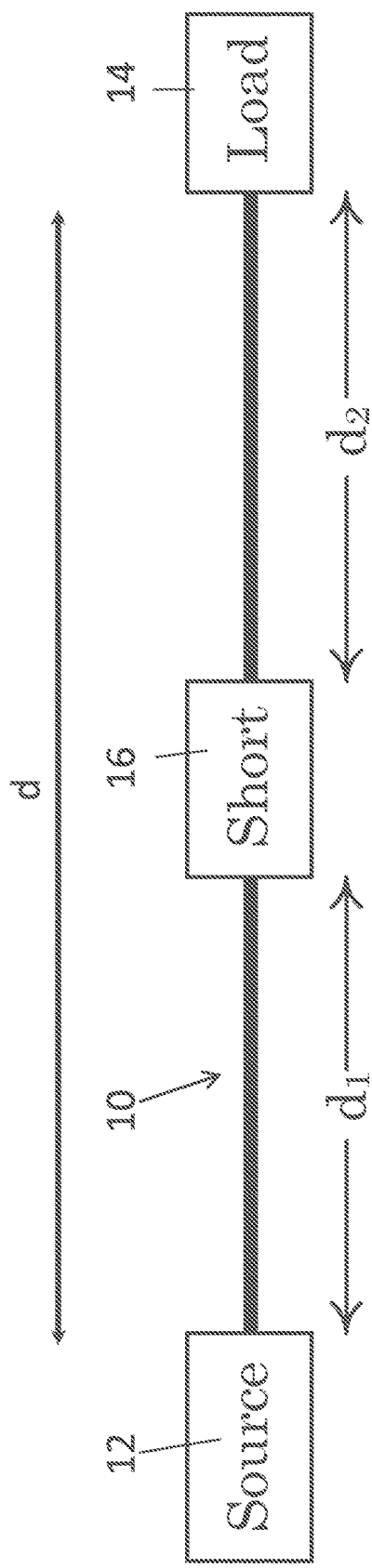
FIG. 1A is a simplified diagram of a line with a fault to which the present embodiments may be applied.

The present invention, in some embodiments thereof, relates to a system and method for locating a fault on a line, and, more particularly, but not exclusively, to a system and method that uses a signal created by the fault along the line to determine the fault location.

A first sampler samples a pulse from the fault at a predetermined sampling rate. A differentiator produces a differential or derivative of the detected pulse and an analyzer obtains timing information from the derivative, from which it is possible to locate the fault knowing the total length of the line and the wave propagation rate. The use of the differential provides more precise timing information than the pulse itself and a rapid sampling rate may obtain sufficient data points as needed for a meaningful differential.

An embodiment that uses two sensors at either end of the line compares the timing of the reflection with the timing of the original pulse as it arrives at the far end of the transmission line in order to more accurately locate the fault. Again the differential is used at the far end in order to obtain accurate timing information.

The two sampling devices, which may be but are not necessarily at opposite ends of the transmission line, may both be synchronized. Synchronization may be achieved for example by synchronizing each ends to the global positioning system like GPS or other, so as to provide time stamps which can be compared.

Another embodiment uses a single sensor at one end of the line and then further detects subsequent reflections of the original pulse from the fault to find the location of the fault by comparing the timings of the original and the reflection.

The embodiments also relate to a control center that may be connected to pulse sources and samplers for numerous lines and is able to look for faults at any of the connected lines.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1A illustrates a transmission line 10 having a source 12 and a load 14, and a distance d between the source and the load. At some point between the source and the load there is a short circuit 16. The distance between the source and the short circuit is d1, and the distance between the load and the short circuit is d2. The present embodiments may be applied to the transmission line 10 to determine the location of the short, and find either d1 or d2 or even determine both independently for greater certainty, as will be explained in greater detail hereinbelow.

The short 16 produces a pulse which propagates in either direction, both to the source end 12 and to the load end 14.

Figure 1B:
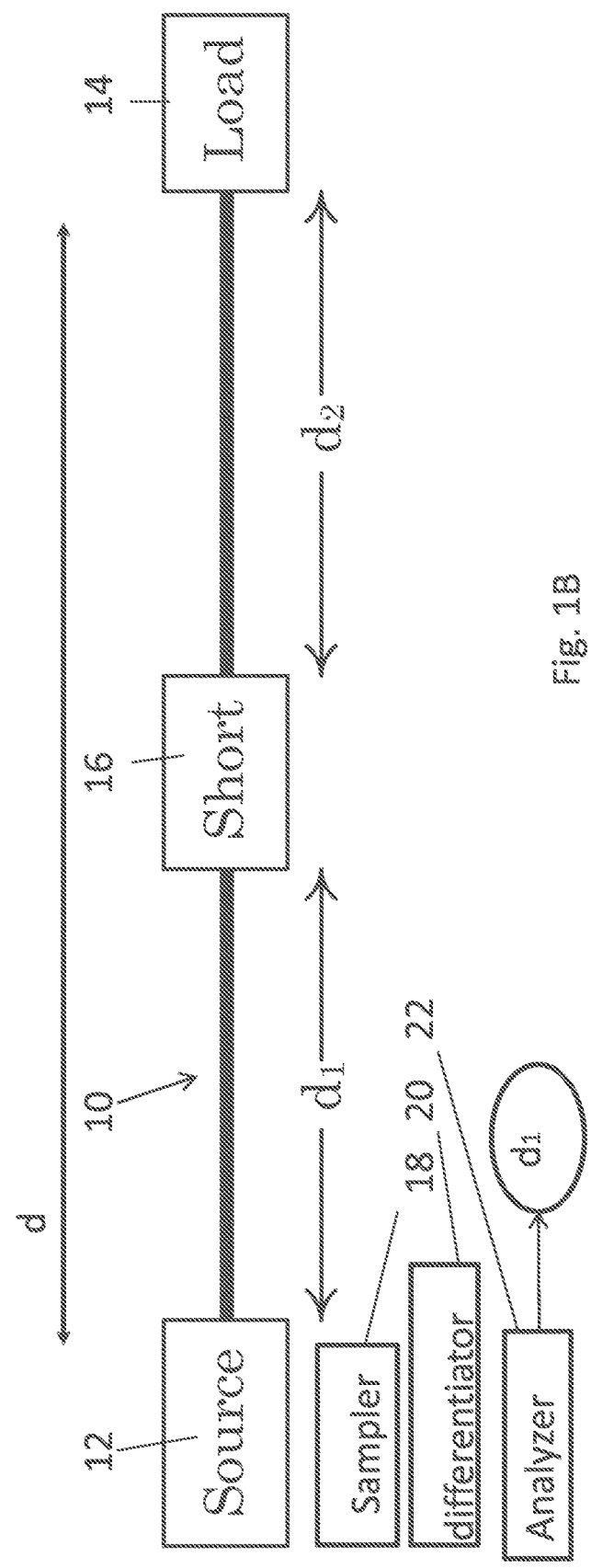
FIG. 1B is a simplified diagram showing an embodiment of the present invention in which a pulse arrived from a fault is sampled and differentiated at a pulse source end.

Referring now to FIG. 1B, the pulse generated by the fault, arrives at a first sampler 18 which samples the line to identify the pulse. Sampling is carried out at a predetermined sampling rate which will be discussed in greater detail below.

Differentiator 20 produces a differential or derivative of the pulse. As will be shown with respect to various graphs herein below, the derivatives, which can be first or second order derivatives, can provide far more accurate timing information than the pulse itself.

Analyzer 22 analyzes the differential to recover timing information, from which it is possible to recover the distance d1 from the sampler to the fault, as will be explained in greater detail below.

Further sampling may be carried out of subsequent echoes of the pulse. A reflection from the far end of the line but originating at the fault will have traveled a distance of (2d2+d1), allowing distances d1 and d2 to be calculated with a single sensor. In a different setup, the fault may be at one end of the line, and the sensor at a distance d1 from the fault, with the end of the line at d=d1+d2 beyond the sensor. In this case the initial pulse travels a distance d1 and the echo travels d1+2d2.

Figure 1C:
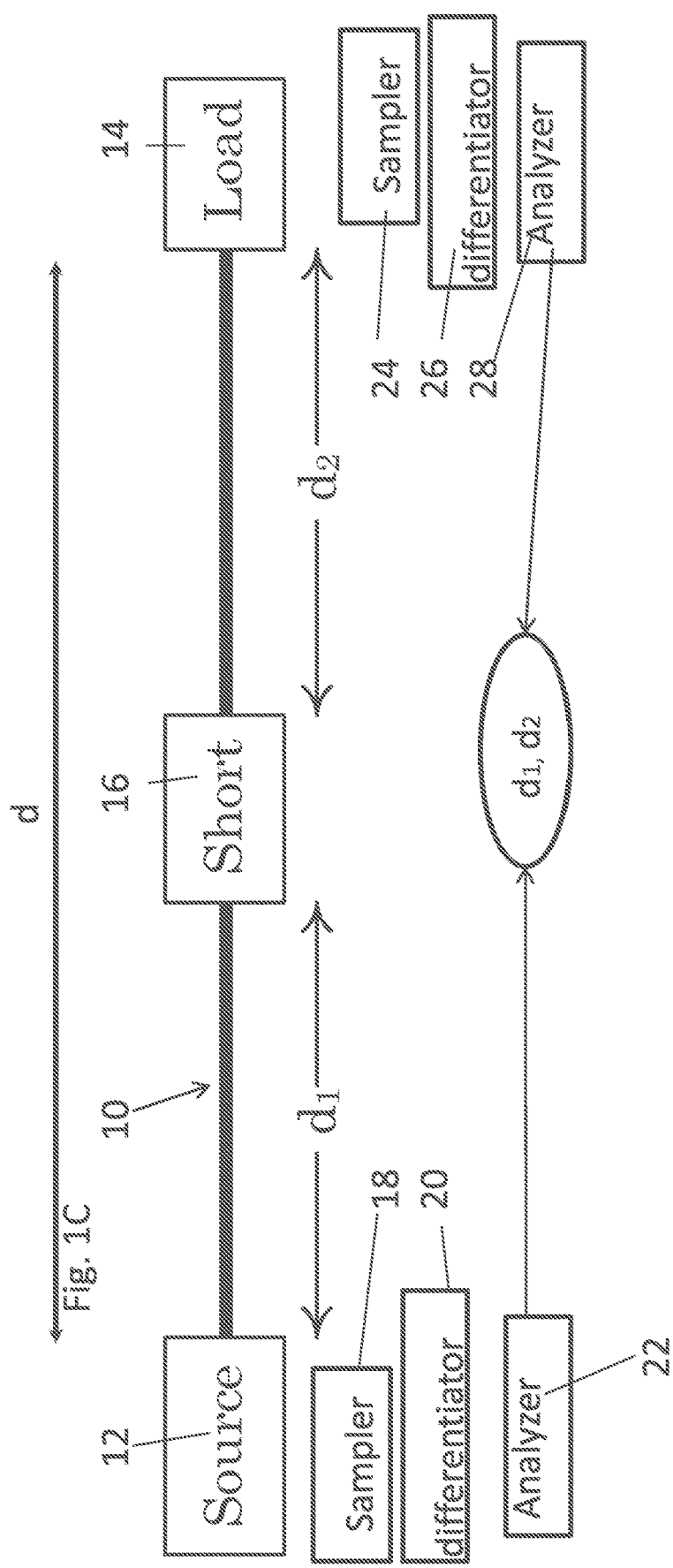
FIG. 1C is a simplified diagram showing an embodiment of the present invention in which a pulse arrived from a fault is sampled and differentiated at a pulse source and the pulse itself is detected at a load end.

Reference is now made to FIG. 1C, which illustrates a further embodiment of the present invention, in which the pulse is sampled at the load, in addition to sampling of the pulse at the source. At the load, a second sampler 24 samples the pulse, and differentiator 26 obtains the differential or derivative as before. Analyzer 22 then extracts timing information. The two analyzers are far apart and for their timing information to be compatible they need to be synchronized. In particular as speeds close to the speed of light, relativistic speeds, are being considered, the two analyzers may require be synchronized from a relativistic point of view, and one way of doing this is to synchronize each device to the GPS system.

It is to be appreciated that sampling may be carried out at any locations along the transmission lines and the only condition is that the distance between the samplers is known. In the following discussion, examples are given of sampling at the ends of the line, source and load, at the fault itself and half way between the fault and the source or the load. However these examples are not limiting and sampling may be carried out at convenient locations where sampling equipment happens to be located.

If the two lots of timing information are available then the location of the fault can be derived, either at one analyzer using reflections, or at one of the two analyzers or at a separate computing device, using a proportion based on half of the time taken by the pulse to arrive at the first sampler 18 compared with a time taken by the pulse to arrive at the second sampler 24, so that both analyzers contribute the data used in locating the fault. More detailed equations will be given herein below for a more exact derivation of the quantity.

The sampling rate used may be in the gigahertz range to obtain the required fault location accuracy, so that a meaningful derivative may be obtained from the pulse samples, and the rate of propagation of the pulse through the line is used to determine the sampling rate, as will be explained in greater detail in the following.

In the case of sampling at both ends, a distance from one end to the other end of the transmission line, d, is known. A distance d1 from the source end to the fault is unknown and a distance from the fault to the second end, d2=d−d1 is also unknown. A time of arrival of the pulse at the source end is t1, and a time of arrival of the pulse at the load end is t2. The time values t1 and t2 are obtained by the process of sampling and then obtaining the derivative or differential. The propagation velocity of the pulse over the line is v, which is a value that can be calculated. With this information, the analyzer, may calculate $\Delta t = t2-t1$ and from that can calculate the distance to the fault from the source end $d_1 = \frac{1}{2}(d - v\Delta t)$ and thus give the location of the fault.

Given the propagation rate of the wave along the line, v, the sampling rate may be set to 2/v, so as to provide the level of detail needed in order to obtain a useful derivative.

As discussed, the line 10 may be an electrical transmission line and the fault may be a short circuit or a disconnection. The samplers may sample either current or voltage.

Alternatively, the line may be an optical line and the fault may be a break in the optical line. Again a reflection may be measured, and if the break is partial then an ongoing pulse may arrive at the terminal. The mathematics is the same, and the wave propagation is calculated in the same way.

As a further alternative the line is a pipe, say a water pipe or a gas pipe or an oil pipe. The fault is a break and the pulse is an acoustic pulse. Again the mathematics is the same, although the velocity is much lower and relativistic issues do not apply.

In an embodiment, successive pulses may be sent down the line to give multiple successive samples. The successive samples may for example be placed in a fixed size buffer with oldest samples being deleted to make way for new samples.

Reference is now made to FIG. 2A, which is a simplified flow chart showing a process for locating a fault on the line according to the embodiment of FIG. 1B. In FIG. 2A, a fault occurs 30, and the pulse emanating from the fault is sampled 32 at the predetermined sampling rate. Subsequently, later reflections of the pulse may be obtained, having travelled greater distances. For each sample, a derivative or differential signal is obtained 34, and timing information is then obtained 36 from the differential. The different samples are compared. The wave propagation velocity along the line is known from calculation so that the location of the fault can be determined 38 from the timing information. The main pulse has traveled a distance d1. A first reflection from the far end has traveled (2d2+d1) and so on, allowing d2 and d1 to be recovered to locate the fault. In an alternative configuration, in which the fault is at one end, and the sensor lies at a distance d1 from the fault and a distance d2 from the far end, a first pulse arrives having travelled a distance d1 and the first reflection arrives after having travelled a distance d1+2d2.

Reference is now made to FIG. 2B, which illustrates the procedure of the embodiment of FIG. 1C. In FIG. 2B a fault occurs 30 and a pulse from the fault is sampled 32 at the predetermined sampling rate. A derivative or differential signal is obtained 34, and timing information is then obtained 36 from the differential.

In addition, the pulse is sampled 40 at the far end of the line. Again a differential or derivative is obtained 42 and timing information is obtained 44 from the derivative.

The wave propagation velocity along the line is known from calculation so that the location of the fault can be determined 38 from the timing information of the pulse itself, and in addition from reflections.

Now considered in greater detail the present embodiments relate to the ability to locate the short circuit in the transmission line from the electromagnetic signal created as a result of that same short circuit. The basic questions are:

What is the signal velocity, an what is the required sampling rate?

What should be measured? Should it be voltage or current or both or does it not matter?

Should the measurement be one-sided or two-sided?

The following uses three circuit theory models to answer the above questions.

Model 1

Figure 3:
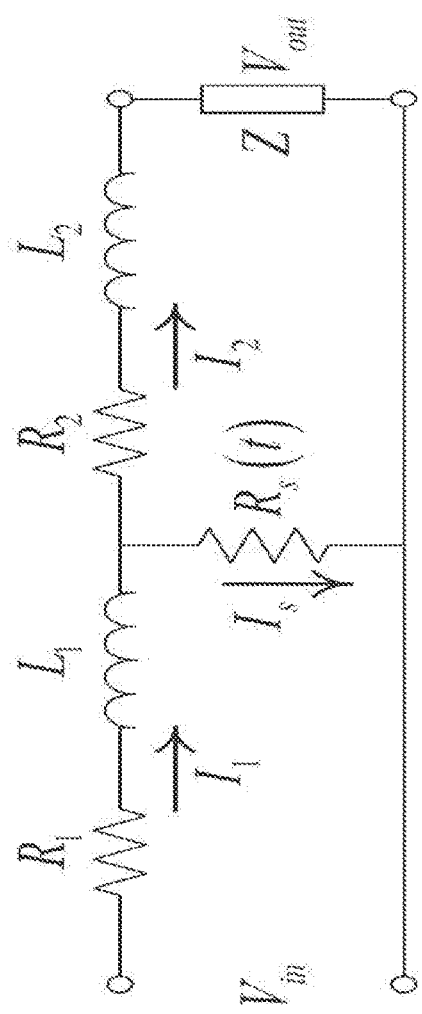
FIG. 3 is a simplified schematic diagram of a transmission line with a short located by the present embodiments as modeled by inductive and resistive components.

Reference is now made to FIG. 3 which shows the transmission line as a combination of resistors and inductors. The line has a short circuit fault, represented by Rs, through which flows a short circuit current Rs. The line prior to the short has resistance R1 and inductance L1 and produces current I1. The line past the short has a current I2, a resistance R2 and an inductance L2. The load Z has a voltage Vout, and the input to the circuit is Vin.

The inductive model of FIG. 3 treats the parts of the transmission line before and after the short-circuit as resistor and inductor connected in series. The short-circuit is assumed to behave exponentially $$R_S(t) = R_{S0} e^{\frac{t}{\tau_S}}.$$

The Kirchhoff voltage law provides:

$$V_{in}(t) = R_1 I_1(t) + L_1 \frac{dI_1(t)}{dt} + V_S(t), \quad (1)$$

$$V_S(t) = R_2 I_2(t) + L_2 \frac{dI_2(t)}{dt} + V_{out}(t)$$

As a first move, we ignore the inductance. The currents in this case are:

$$I_1(t) = \frac{Z + R_2 + R_S(t)}{R_1(Z + R_2 + R_S(t)) + R_S(t)(Z + R_2)} V_{in}(t) \quad (2)$$

$$I_2(t) = \frac{R_S(t)}{R_1(Z + R_2 + R_S(t)) + R_S(t)(Z + R_2)} V_{in}(t)$$

$$I_S(t) = \frac{Z + R_2}{R_1(Z + R_2 + R_S(t)) + R_S(t)(Z + R_2)} V_{in}(t)$$

In the inductive model of FIG. 3, the transmission line is a two-wire copper cable, each wire has a diameter d, and the distance between them is D. Note that these symbols are independent of those used in FIGS. 1A-C. The total cable length is l. Values used are shown in table 1.

TABLE 1 two-wired cable parameters

| Parameter | Value | Unit |
| --- | --- | --- |
| $\sigma_c$ (Copper) | $5.96 \cdot 10^7$ | S/m |
| d | 0.06 | M |
| D | 2 | M |
| l | 1000 | M |

The surface resistance may be written as follows [ref—Jackson]:

$$R_{Serface} = \sqrt{\frac{\omega \mu_c}{2\sigma_c}} = \sqrt{\frac{\pi f \mu_c}{\sigma_c}} \ [\Omega]$$

Hence, the resistance per unit length can be written as $$R = 2 \frac{R_{surface}}{2\pi \frac{d}{2}} = 2 \frac{R_{surface}}{\pi d} \left[\frac{\Omega}{m}\right]$$

The values used to describe the cable are given in table 2.

TABLE 2 two-wired cable resistance

| Parameter | Value | Unit |
| --- | --- | --- |
| $\mu = \mu_c$ | $4\pi \cdot 10^{-7}$ | H/m |
| f | 50 | Hz |

TABLE 2-continued two-wired cable resistance

| Parameter | Value | Unit |
|---|---|---|
| $R_{surface} = \sqrt{\dfrac{\pi f \mu_c}{\sigma_c}}$ | $1.82 \cdot 10^{-6}$ | $\Omega$ |
| $R = 2\dfrac{R_{surface}}{\pi d}$ | $1.93 \cdot 10^{-5}$ | $\dfrac{\Omega}{m}$ |

The short circuit appears at distance $l_1$ from the input. The characteristic time $\tau_s = 10 \div 100$ [ns] depends on conditions and geometry of the short circuit region. The short circuit resistance at t=0 is the air resistance in the region. The short circuit parameters are shown in the table 3.

TABLE 3 short circuit parameters

| Parameter | Value | Unit |
|---|---|---|
| $l_1$ | 300 | m |
| $l_2 = l - l_1$ | 700 | m |
| $\tau_S$ | 100 | Nano-Second |
| $\rho_{S0}$ (Air) | $1.3 \cdot 10^{16}$ | $\Omega$m |
| $l_S$ | 0.1 | m |
| $A_S$ | 0.0004 | m$^2$ |
| $R_{S0} = \dfrac{\rho_{S0} l_S}{A_S}$ | $3.25 \cdot 10^{18}$ | $\Omega$ |

Figures 4, 5A:
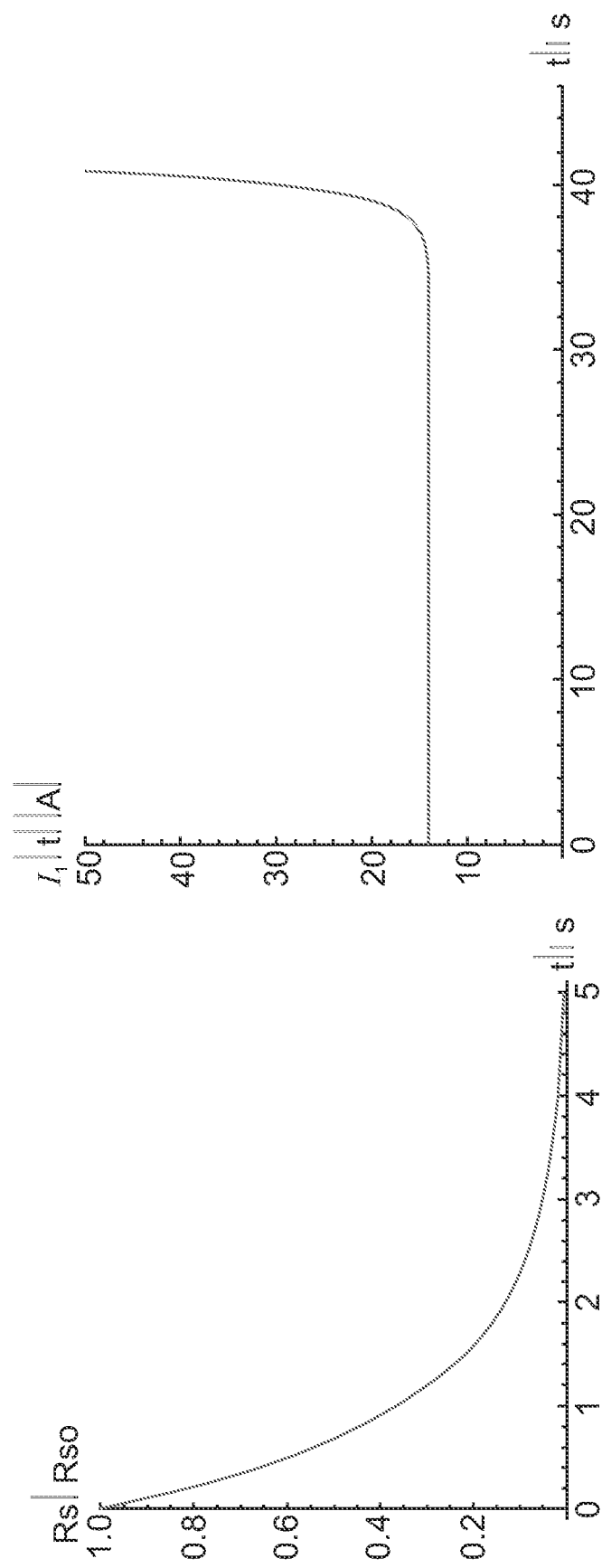
FIG. 4 is a simplified graph showing short circuit resistance as the short circuit fault develops.
FIG. 5A is a simplified graph showing source current prior to development of the short circuit, as may be obtained by sampling according to the present embodiments.

The short-circuit $$R_S(t) = R_{S0} e^{-\frac{t}{\tau_S}}$$

resistance is shown in FIG. 4.
The transmission line resistances and the load impedance described in the following table:

TABLE 4

Transmission line resistance and the load impedance

| Parameter | Value | Unit |
|---|---|---|
| $R_1 = R \cdot l_1$ | 0.00579 | $\Omega$ |
| $R_2 = R \cdot l_2$ | 0.0135 | $\Omega$ |
| $R_T = R_1 + R_2$ | 0.0193095 | $\Omega$ |
| Z | 15.625 | $\Omega$ |

The input voltage is assumed to be of the form $V_{in}(t) = A_0 \cos(\omega \cdot t)$, where $A_0 220[V], \omega = 2\pi f = 100\pi [rad/s]$.

Figure 5B:
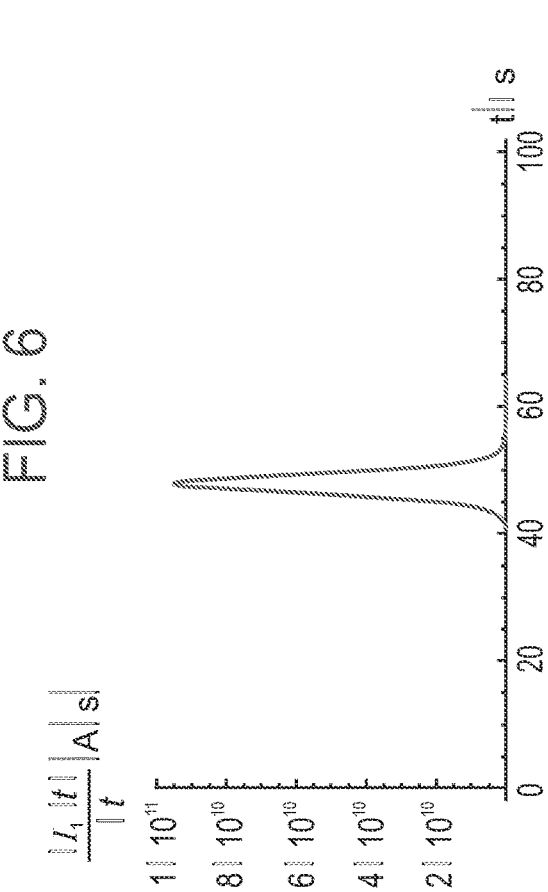
FIG. 5B is a simplified graph schematically showing source current following development of the short circuit as may be obtained by sampling according to the present embodiments.
Figure 7:
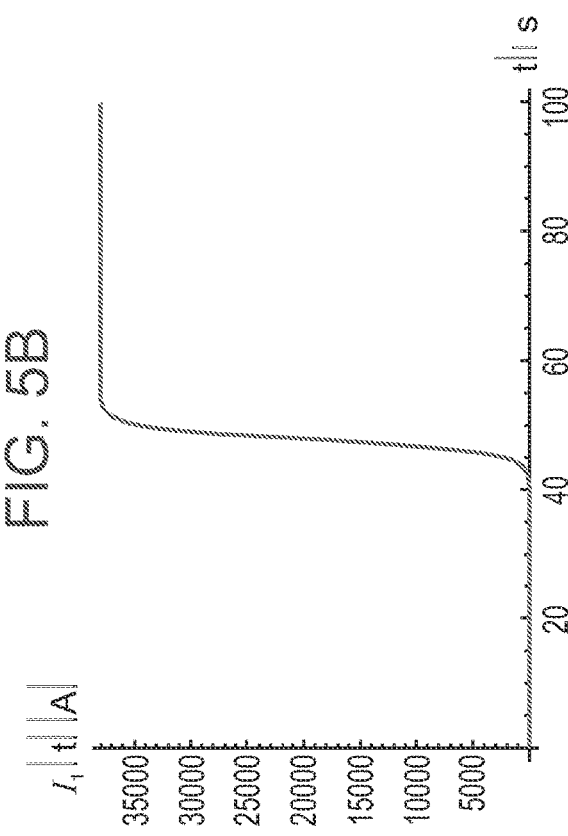
FIG. 7 is a simplified graph schematically showing load current as may be obtained by sampling according to the present embodiments.
Figure 6:
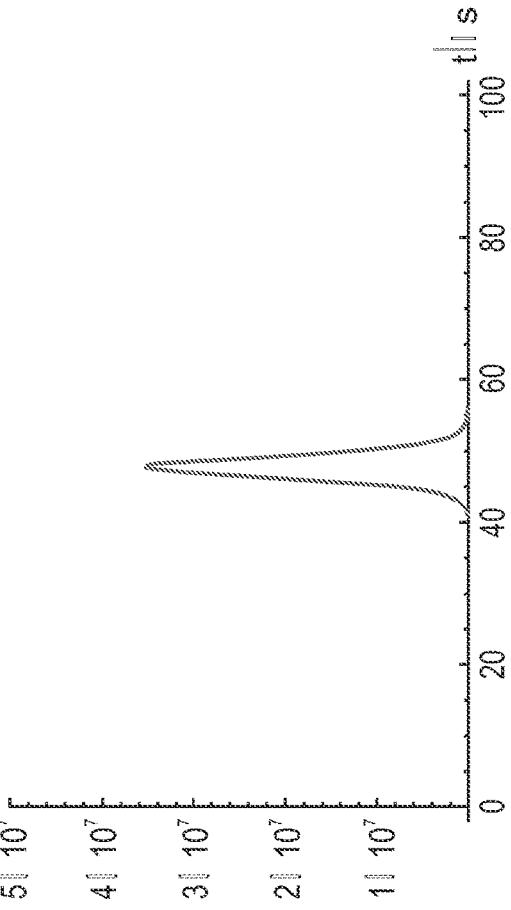
FIG. 6 is a schematic illustrating of a derivative obtained from the source current in FIG. 5B according to the present embodiments.

Calculation results are presented as follows:
Current
The source current before the short circuit is shown in FIG. 5A and is shown to rise. FIG. 5B shows the current after the short circuit, and FIG. 6 shows the source current derivative. It should be apparent that the derivative has a sharp rise, a defined peak and a defined fall, making it easier to get precise timing information than any of the pure current graphs.
On the load side, the current vanishes after the short occurs and this situation of current fall is shown in FIG. 7 which illustrates the load current.

Figure 8:
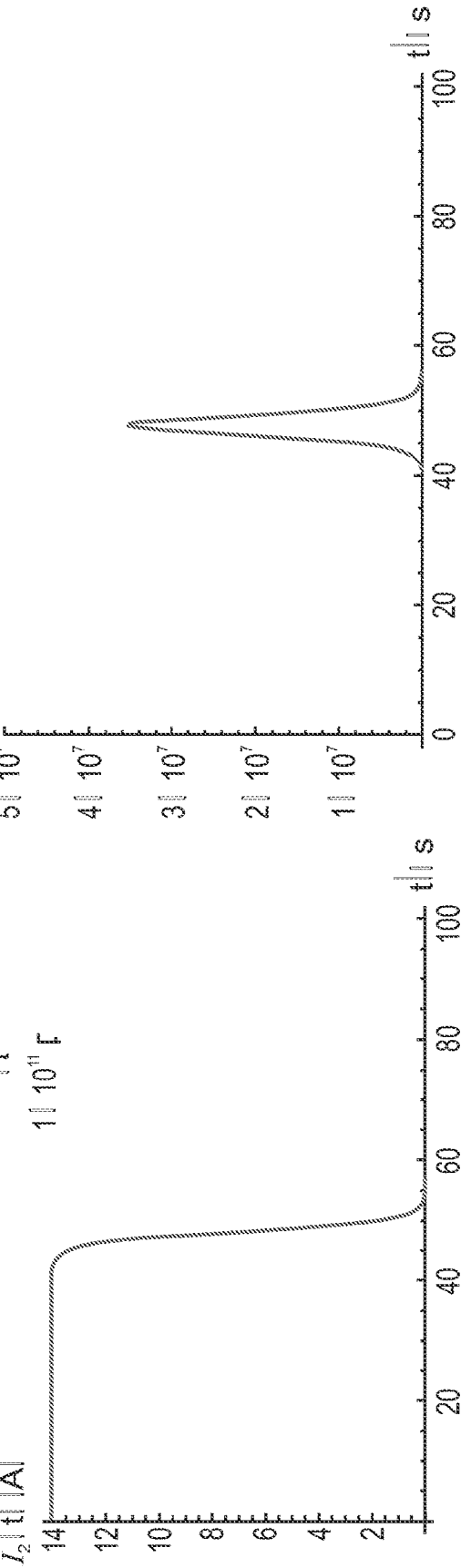
FIG. 8 is simplified graph schematically showing the load current derivative obtained according to the present embodiments.

It is apparent that on the load side the current behavior allows the short to be recognized in the same way as at the source side, simply by taking the current derivative. The result is shown in FIG. 8, which shows the load side current derivative.

Voltage

The short circuit pulse may be also detected by voltage measurement. For example, the voltage measured at half a distance between the source and the short may be given by.

$$V_1(t) = V_{in}(t) - \tfrac{1}{2} R_1 I_1(t)$$

and is shown in FIG. 9 where the voltage drops in the event of the short occurring.

Reference is now made to FIG. 10, which shows the voltage derivative at half the distance between the source and the short, that is to say the derivative corresponding to FIG. 9. The derivative contains an indication regarding the short, again with a clear rise, peak and fall, allowing accurate timing information to be obtained.

The voltage at the location of the short itself vanishes since the resistance approaches zero during the short, and it is this phenomenon that provides the behavior that allows pulse indication based on the voltage derivative.

FIG. 11 shows the voltage at the short itself falling to zero. FIG. 12 shows the derivative.

Referring now to FIG. 13, the voltage at half the distance between the short and the load may be measured, and, the pulse may be detected using the voltage derivative.

$$V_2(t) = V_s(t) - \tfrac{1}{2} R_2 I_2(t)$$

FIG. 14 shows the corresponding voltage derivative for FIG. 13, namely the derivative at half the distance between the short and the load.

Summarizing the results of model 1, we saw that the current and voltage measurements allow for pulse detection and the derivative of the pulse gives an indication of the occurrence and location of the short.

Likewise, it is shown that detection is possible both on the source and on the load side. In order to detect the pulse, resolution of the order of $\tau_s$ is needed. In the model of FIG. 3 there is no pulse propagation description along the transmission line, for this purpose a more complicated model is required.

Model 2

In model 2 the same circuit elements as in FIG. 3 are considered, however the transmission line inductance is no longer neglected. In that case the equations (1) become coupled differential equations that can only be solved numerically. The two wired cable induction can be calculated and the inductance values are shown in table 5:

TABLE 5 transmission line inductance

| Parameter | Value | Unit |
|---|---|---|
| $L = \dfrac{\mu}{\pi} \operatorname{arcosh}\left(\dfrac{D}{d}\right)$ | $1.68 \cdot 10^{-6}$ | $\dfrac{H}{m}$ |
| $L_1 = L \cdot l_1$ | 0.000503938 | H |
| $L_2 = L \cdot l_2$ | 0.00117585 | H |
| $L_T = L_1 + L_2$ | 0.00167979 | H |

The initial current is given as follows $$I_{10}(t) = I_{20}(t) = \frac{A_0 \cdot A_t \cdot \cos[\omega \cdot t + \phi_1]}{Z + R_T}$$

Where:

$$A_t \equiv \frac{1}{\sqrt{1 + (\omega \cdot \tau_p)^2}}, \phi_t \equiv -\arctan[\omega \cdot \tau_p], \tau_p \equiv \frac{L_T}{Z}$$

Figure 16:
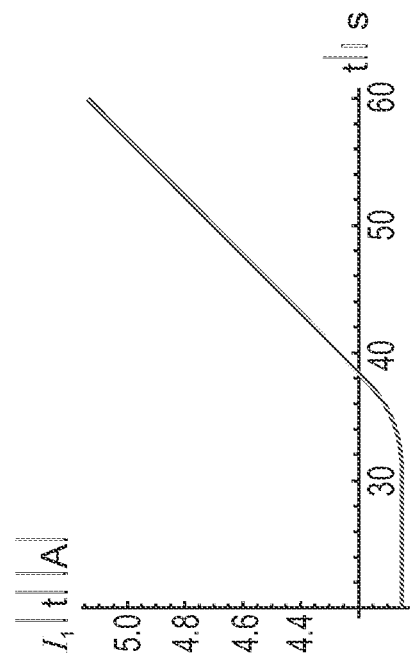
FIG. 16 schematically illustrates source current immediately after occurrence of the fault according to the second model as may be obtained by sampling according to the present embodiments.
Figure 15:
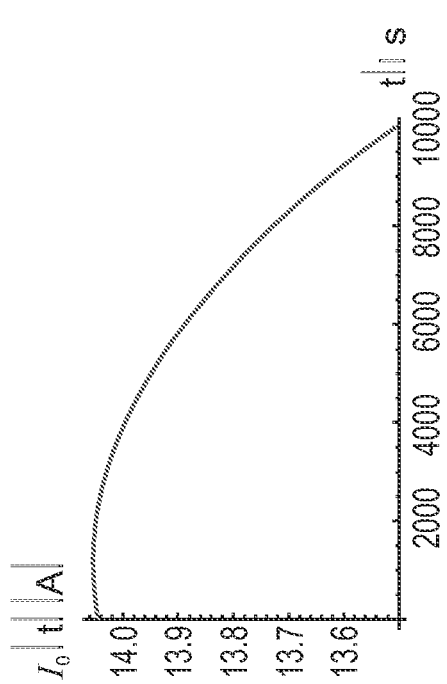
FIG. 15 schematically illustrates initial current in model 2 according to the present embodiments.
Figure 17:
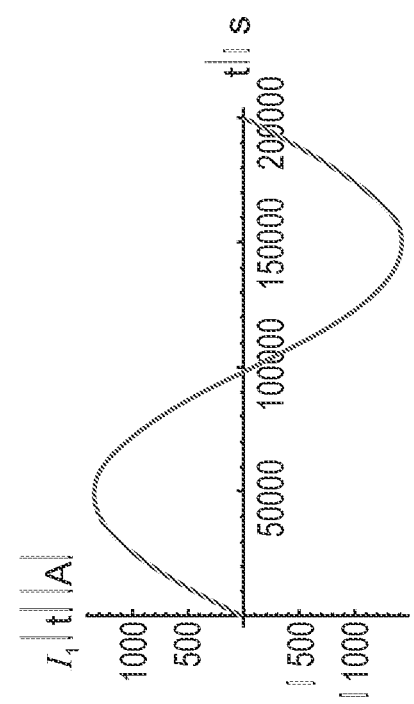
FIG. 17 schematically illustrates the source current a significant time after occurrence of the fault according to the second model as may be obtained by sampling according to the present embodiments.

The initial current is shown in FIG. 15, based on the numerical solution results of the model.
The Current
The source current result is shown in FIGS. 16 and 17, where FIG. 16 shows the timescale right after occurrence of the short and FIG. 17 shows the steady state reached after some time.

Figure 18:
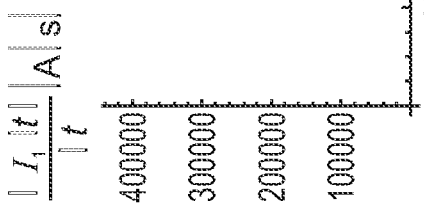
FIG. 18 schematically illustrates the first derivative of the source current of FIG. 17 as may be obtained using the present embodiments.

Reference is now made to FIG. 18, which shows the first derivative of the current. In the previous model, model 1, the derivative had a pulse shape. In the present model, the first derivative rises but has no peak or falloff, making it more difficult to obtain clear timing information. The problem may be solved by using the second derivative, as shown in FIG. 19 which has a clear pulse shape.

The current measurements on the load side also provide a short pulse detection ability. The load current right after occurrence of the short is shown in FIG. 20. FIG. 21 shows the short current after it has settled down into a steady state. In the long term as shown in FIG. 21 an exponential current decay is evident.

The first and second derivatives of the load side current are shown in FIGS. 22 and 23 respectively.

It is apparent that only the second derivative, as shown in FIG. 23, has a pulse shape allowing for clear timing information. Thus the location of the short may be detected using the current second derivative. The derivative used may be measured on either the source or the load side.

In the following the current at the location of the short itself is investigated. It is clear that the current across the short is zero before the short happens. Then, upon occurrence of the short, the current grows linearly as shown in FIG. 24. After some time the short current reaches the characteristic source current values and falls off as shown in FIG. 25.
The Voltage The short-circuit pulse may also be detected by voltage measurement between the source and the short. If the voltage is measured at half the distance between the source and the short due to high short current, the voltage will be:

$$V_1(t) = V_{in}(t) - \frac{1}{2}R_1 I_1(t) - \frac{1}{2}L_1 \frac{dI_1(t)}{dt}$$

The voltage and its derivative are shown in FIGS. 26 and 27 respectively.

FIGS. 28 and 29 show the voltage and its derivative at the short-circuit itself. In FIG. 28 we see the voltage on the short when the resistivity goes to zero, that is, as the short is created, and in FIG. 29 we see pulse behavior in the voltage derivative.

Analogous results may be obtained if the voltage is measured on the load side even if the measurement is not on the load itself. For example, for half a distance voltage measurement, one gets:

$$V_2(t) = V_s(t) - \frac{1}{2}R_2 I_2(t) - \frac{1}{2}L_2 \frac{dI_2(t)}{dt}$$

FIGS. 30 and 31 show the voltage at half the distance between the short and the load right after the short and after some time (respectively).

The voltage derivative has pulse behavior, as shown in FIG. 32.

Finally, the load voltage is described, which is proportional to the load current:

$$V_{out}(t) = Z \cdot I_2(t)$$

Figures 33, 34, 35, 36:
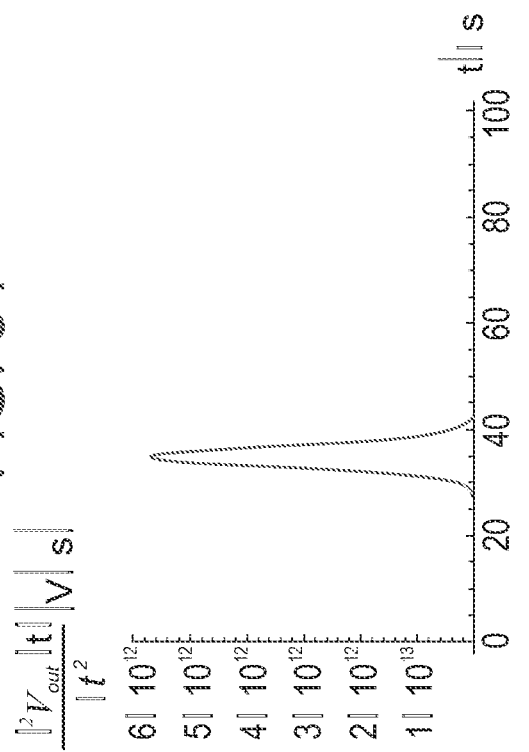
FIG. 33 schematically illustrates load voltage directly after occurrence of a fault as may be obtained by sampling according to the present embodiments.
FIG. 34 schematically load voltage sufficiently long after occurrence of a fault to allow steady state conditions to be reached, as may be obtained by sampling according to the present embodiments.
FIG. 35 schematically illustrates the first derivative of the load voltage of FIG. 34 as may be obtained using the present embodiments.
FIG. 36 schematically illustrates the second derivative of the load voltage of FIG. 34 as may be obtained using the present embodiments.

The load voltage right after the occurrence of the short and after some time are shown in FIGS. 33 and 34 respectively.

The first and the second load voltage derivatives are shown in FIGS. 35 and 36, here making clear that in the case of the load voltage the second derivative may provide the best timing information.

In the framework of model 2 we see that neither voltage nor current measurements allow short pulse detection directly. Generally, the first voltage derivative is enough (except the load voltage) while in the case of current measurement the second derivative is necessary. The required resolution, in order to detect the pulse, is of order of $\tau_s$. Model 2 does not consider wave propagation. For a more accurate location of the fault, a more complicated model is discussed below.

Model 3

Figure 37:
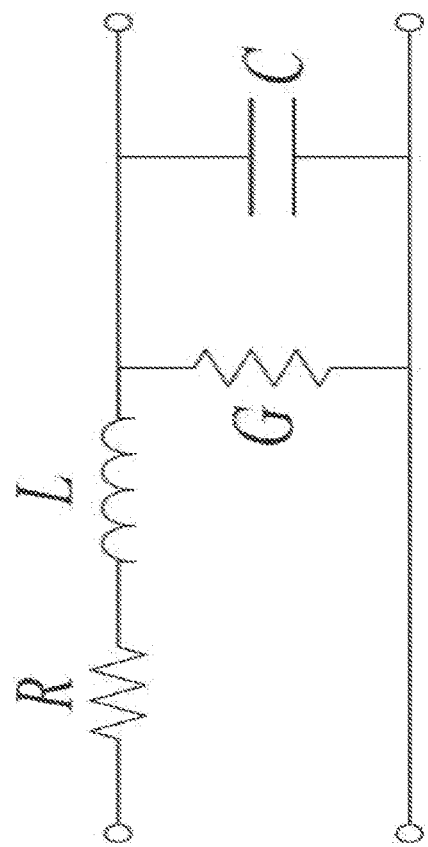
FIG. 37 schematically illustrates a transmission line modeled using a transverse electromagnetic wave (TEM) propagation model, to which the present embodiments may be applied to determine the location of a short circuit.

In models 1 and 2, the derivations have ignored signal propagation in the circuit and assumed the changes in the voltage and the current happen immediately and simultaneously everywhere. That assumption is not compatible with the theory of special relativity which says that any signal can only propagate with finite velocity smaller the speed of light in vacuum. To describe that behavior we use the TEM transmission line propagation model as represented in FIG. 37. Transmission lines typically convey electrical signals and power from point to point along arbitrary paths with high efficiency, and can also serve as circuit elements. In most transmission lines, the electric and magnetic fields point purely transverse to the direction of propagation; such waves are called transverse electromagnetic or TEM waves, and such transmission lines are called TEM lines.

In FIG. 37 the line resistance is R, the line inductance is L, a conductance between the wires is given by G, and capacitance between the wires is given by C. Measurements for these values are all given per unit length.

The equations that describe the voltage and the current dependence are as follows:

$$\frac{\partial V(x,t)}{\partial x} = -RI - L\frac{\partial I(x,t)}{\partial t}$$

$$\frac{\partial I(x,t)}{\partial x} = -GV - C\frac{\partial V(x,t)}{\partial t}$$

Derivation Using the Frequency Domain

The above equations may be transformed to the frequency domain, where they take the form:

$$\frac{\partial V(x, \omega)}{\partial x} = -(R + i\omega L)I(x, \omega)$$

$$\frac{\partial I(x, \omega)}{\partial x} = -(GV + i\omega C)V(x, \omega)$$

Combining these two equations, one can write another two equations $$\frac{\partial^2 V(x, \omega)}{\partial x^2} = \gamma^2 V(x, \omega)$$

$$\frac{\partial^2 I(x, \omega)}{\partial x^2} = \gamma^2 I(x, \omega)$$

where we define:

$$\gamma = \sqrt{(R+i\omega L)(G+i\omega C)}$$

These equations have a solution of the form $$V(x, \omega) = V^{(+)}(\omega)e^{-\gamma x} + V^{(-)}(\omega)e^{\gamma x}$$

$$I(x, \omega) = \frac{1}{Z_0}(V^{(+)}(\omega)e^{-\gamma x} - V^{(-)}(\omega)e^{\gamma x})$$

The functions $V^{(\pm)}(\omega)$ are derived from the initial conditions. The impedance $Z_0$ is defined as follows:

$$Z_0 \equiv \sqrt{\frac{R + i\omega L}{G + i\omega C}}$$

In the case where the resistivity and the leakage admittance are small enough, they can be neglected, and the approximated impedance takes the form $$R \ll \omega L, G \ll \omega C$$

$$Z_0 \cong \sqrt{\frac{L}{C}}$$

and, hence, $$\mathrm{Re}(\gamma) \approx \frac{\sqrt{LC}}{2}\left(\frac{R}{L} + \frac{G}{C}\right)$$

$$\mathrm{Im}(\gamma) \approx \sqrt{LC}$$

As the frequency rises, the approximation becomes more accurate. Using that approximation the voltage along the transmission line is as follows:

$$V(x, t) \approx V_{in}\left(t - \sqrt{LC}\,x\right)\exp\left(-\frac{\sqrt{LC}}{2}\left(\frac{R}{L} + \frac{G}{C}\right)\right)$$

From that solution we see that the voltage has an exponential decay with Re ($\gamma$) and a propagation speed:

$$v = \frac{1}{\sqrt{LC}}$$

Assuming the transmission line to be a two wired cable described earlier, we get the following parameters:

$$R = \frac{2R_s}{\pi d},$$

$$L = \frac{\mu}{\pi}\cosh^{-1}\left(\frac{D}{d}\right),$$

$$G = \frac{\pi\sigma}{\cosh^{-1}\left(\frac{D}{d}\right)},$$

$$C = \frac{\pi\varepsilon}{\cosh^{-1}\left(\frac{D}{d}\right)}$$

where each wire has a diameter d, distance between them is D. The material between the wires has a permittivity ε, permeability μ and (a very small) conductivity σ. The wires resistance is calculated, as before, using the surface resistance:

$$R_s = \sqrt{\frac{\pi f \mu_c}{\sigma_c}}$$

The wave propagation velocity in this case is given by:

$$v = \frac{1}{\sqrt{\varepsilon\mu}} = \frac{c}{n}$$

Where, n is the index of refraction around the transmission line. It should be noted that electromagnetic wave is propagating in the region between the conductors and not in the conductors themselves, where the propagation is much slower and the decay is very strong. The schematic description of the transmission line with a short circuit is given in FIG. 1A, as discussed above.

The total distance between the source and the load is known $$d = d_1 + d_2$$

Hence, the signal formed due to the short at $t_0$ reaches the sensors at the source and the load at $t_1$ and $t_2$ respectively.

$$v(t_1 - t_0) = d_1\, v(t_2 - t_0) = d_2$$

Defining the time difference $\Delta t \equiv t_2 - t_1$, the distance to from the source to the short may be written as $$d_1 = \tfrac{1}{2}(d - v\Delta t)$$

If the required distance measurement precision is of order of 1 meter, then the time measurement sampling resolution may be:

$$\Delta t_{min} = \frac{2}{v} \cong \frac{2}{3}10^{-8}\,\mathrm{sec} \cong 6[\mathrm{ns}]$$

Figure 38:
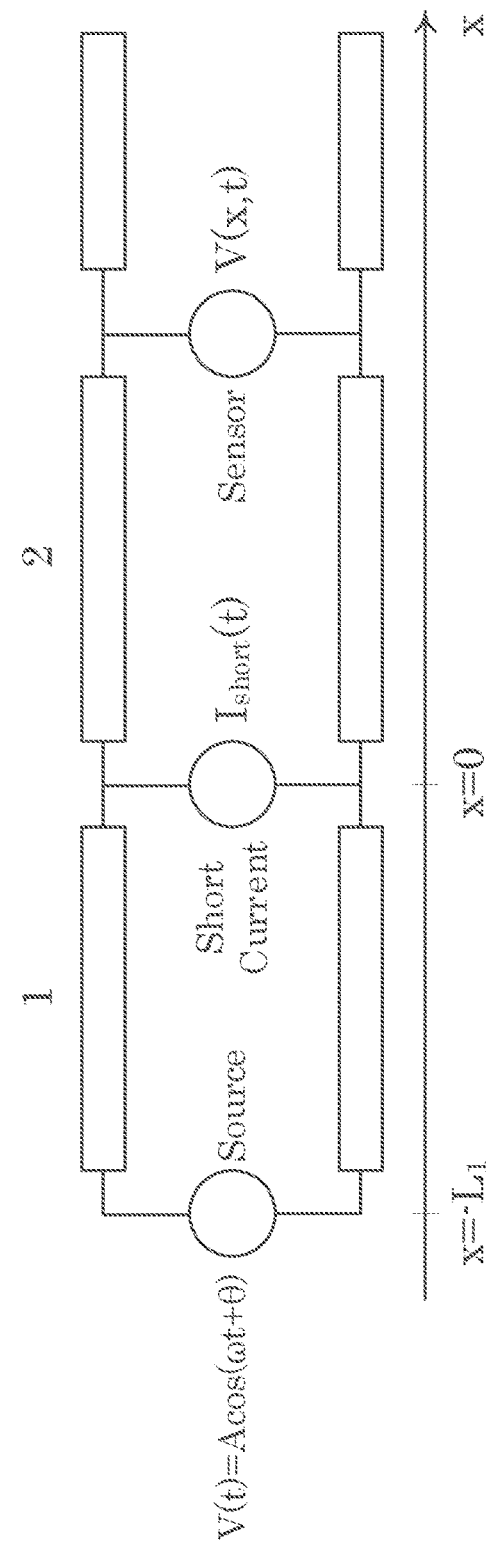
FIG. 38 schematically illustrates the model of FIG. 37 in greater detail with a short circuit at location x=0.

A more detailed model of a short in the transmission line is shown in FIG. 38:

The short appears at some point (x=0) in the transmission line between impedances 1 and 2. A source supplies the measurement pulse which is detected at both the source and the sensor.

$$V_1(\omega, 0) = V_2(\omega, 0)$$

$$I_1(\omega, 0) = I_2(\omega, 0) + I_{short}(\omega)$$

We assume that the short current does not exist at t=0, likewise, the short current after a long time can be calculated using the fact that the voltage on the short vanishes as t→∞.

We start with the first assumption:

$$\lim_{t \to \infty} I_{short}(t) = I_{short\ asymptotic}(t)$$

For the asymptotic short current calculation we obtain the following:

$$V_{short\ asymptotic}(\omega) = V^{(+)}(\omega) + V^{(-)}(\omega) = 0$$

$$V_{asymptotic}(\omega, -L_1) = V^{(+)}(\omega)(e^{\gamma L_1} - e^{-\gamma L_1}) = V_{in}(\omega)$$

$$V^{(+)}(\omega) = \frac{V_{in}(\omega)}{2\sinh(\gamma L_1)}$$

The short current in the frequency domain is:

$$I_{short\ asymptotic}(\omega) = I(\omega, 0) = \frac{2V^{(+)}}{Z_0} = \frac{V_{in}(\omega)}{Z_0 \sinh(\gamma L_1)}$$

The short current in the time domain is:

$$I_{short\ asymptotic}(t) = \frac{A}{Z_0} \text{Re} \frac{e^{j(\theta + \omega_0 t)}}{\sinh(\gamma(\omega_0) L_1)}$$

The second assumption is that the short current vanishes at t=0 $I_{short}(t=0)=0$ In model 3 the requirement of the second assumption may be fulfilled by multiplying the asymptotic expression with some reasonable function that vanishes at t→0, for example:

$$I_{short}(t) = I_{short\ asymptotic}(t)\left(1 - e^{-\frac{t^2}{2\Delta^2}}\right)$$

In fact such behavior contradicts the causality condition, $I_{short}(t \le 0) = 0$ but nevertheless gives a practical result.

The calculation results for the short current at the load side are as follows:

$$I_2(x, t) = \frac{A'}{2Z_0} \begin{bmatrix} e^{-\alpha x} e^{-\frac{(t-t_d)^2}{2\Delta^2}} \cos(\omega_0 (t - t_d) + \theta') - \\ e^{-\alpha(x+2L_1)} e^{-\frac{(t-t_{d2})^2}{2\Delta^2}} \cos(\omega_0(t - t_{d2}) + \theta') \end{bmatrix}$$

where $t_d = \frac{x}{v}$ and $t_{d2} = \frac{x + 2L_1}{v}$.

Also, v is the signal propagation velocity, just as in models 1 and 2.

Derivation using the Laplace Transform.

In the above, a frequency transform was used.

The same differential transforms may be used with a Laplace transform. Laplace transformation of the last equation results in the solutions for the voltage and current waves:

$$V(x, s) = V_{(-)}(s)e^{-x\gamma(s)} + V_{(+)}(s)e^{x\gamma(s)} \quad (3)$$

$$I(x, s) = \frac{V_{(-)}(s)}{Z_0 s}e^{-x\gamma(s)} - \frac{V_{(+)}(s)}{Z_0(s)}e^{x\gamma(s)} \quad (4)$$

where, $$Z(s) = R + sL \quad Y(s) = G + sC \quad (5)$$

$$\gamma(s) = \sqrt{Z(s)Y(s)} \quad (6)$$

$$Z_0(s) = \sqrt{\frac{Z(s)}{Y(s)}} \quad (7)$$

It is reasonable to assume that the conductance G of the separating dielectric material between the wires, is negligible. The series resistivity is calculated taking into account the skin effect:

$$R(s) = \frac{1}{\pi d}\sqrt{\frac{2\mu_c}{\sigma_c}}\sqrt{s} \equiv \xi\sqrt{s}$$

where d is a conductor wire diameter and $$\xi = \frac{1}{\pi d}\sqrt{\frac{2\mu_c}{\sigma_c}}.$$

Consequently, the expression (6) can be written as follows:

$$\gamma(s) = s\sqrt{LC}\sqrt{1 + \frac{R(s)}{sL}} \quad (8)$$

$$= s\sqrt{LC}\sqrt{1 + \frac{\xi}{\sqrt{s}\,L}}$$

$$\approx s\sqrt{LC}\left(1 + \frac{\xi}{2\sqrt{s}\,L}\right)$$

$$= s\sqrt{LC} + \frac{\xi}{2}\sqrt{\frac{C}{L}}\sqrt{s}$$

In practice, the sensor impedance $Z_L$ is designed to be infinite in order not to affect the measurement results. Substituting boundary conditions, $V_{in}(s) \equiv V(0,s) = V_{fault}(s)$ and $Z_L = \infty$, the voltage signal at the sensor due to the fault is:

$$V_{out}(s) \equiv V(l, s) = \frac{2e^{-l\gamma(s)}}{1 + e^{-2l\gamma(s)}} V_{fault}(s) \quad (9)$$

Identifying the last expression as the summation of a geometric series, it can be re-written as the sum:

$$V_{out}(s) = V_{in}(s) \sum_{n=0}^{\infty} 2(-1)^n e^{-(1+n2)l\gamma(s)} \quad (10)$$

Defining $\tau_n \equiv (1+2n)l\sqrt{LC}$ and $$B_n \equiv (1+2n)l\frac{\xi}{2}\sqrt{\frac{C}{L}},$$

the expression for the voltage at the sensor (10) takes the form:

$$V_{out}(s) = V_{in}(s) \sum_{n=0}^{\infty} 2(-1)^n e^{-\tau_n s + B_n \sqrt{s}} \quad (11)$$

Hence, the transfer of the system may be written as follows, $$H(s) \equiv \frac{V_{out}(s)}{V_{in}(s)} = \sum_{n=0}^{\infty} 2(-1)^n e^{-\tau_n s + B_n \sqrt{s}} \quad (12)$$

which allows to obtain the signal measured at the sensor due to any fault waveform. For instance, if the fault is a short circuit at x=0 and t=0, the voltage at the fault location is $V_{in}(t) \equiv V(0,t) = V_0 - V_0 u(t)$. Using the superposition principle, $V_{out}(t)$ may be written as a sum of a DC input and a step function input response.

$$V_{out}(t) = V_{out(V_{in}=V_0)}(t) - V_{out(V_{in}=V_0 u(t))}(t) \quad (13)$$

Since the impedance at the edge is infinite, the voltage along the line due to the DC input is simply $V_0$. Substitution the step function Laplace transform to (10), and inverse the resulted expression back to the time domain, gives:

$$V_{out}(t) = V_0 - L^{-1}\left\{\frac{V_0}{s}\sum_{n=0}^{\infty} 2(-1)^n e^{-\tau_n s + B_n \sqrt{s}}\right\} \quad (14)$$

Taking a known inverse Laplace transform [12], $$L^{-1}\left\{e^{-\tau s}\frac{e^{-B\sqrt{s}}}{s}\right\} = \text{erfc}\left(\frac{B}{2\sqrt{t-\tau}}\right)u(t-\tau) \quad (15)$$

The voltage at the sensor due to the fault is:

$$V_{out}(t) = V_0 - V_0 \sum_{n=0}^{\infty} 2(-1)^n \text{erfc}\left(\frac{B}{2\sqrt{t-\tau}}\right)u(t-\tau_n) \quad (16)$$

The above has been derived for an electrical transmission line as the wave behavior is well-known and there is considerable expertise in making the calculations, however the same holds true for optical fibers and optical reflections and for pipes, say water, gas or oil pipes and acoustic echoes. The calculations for the location of the fault are the same albeit that the rates of propagation are different for the acoustic case. In the optical case the equation v=c/n still holds true. In both cases underground pipes and underground fiber optic cables can be damaged at locations that are hard to reach, and an accurate determination of the location of the fault is helpful in knowing where to start digging.

In the following, two methods are tested experimentally:
1. A method for FDL determination by calculating the values of sinusoidal and free components of the short-circuit currents.
2. A method based on the time evaluation of the current pulse propagation through the line.

Method #1

Figure 39:
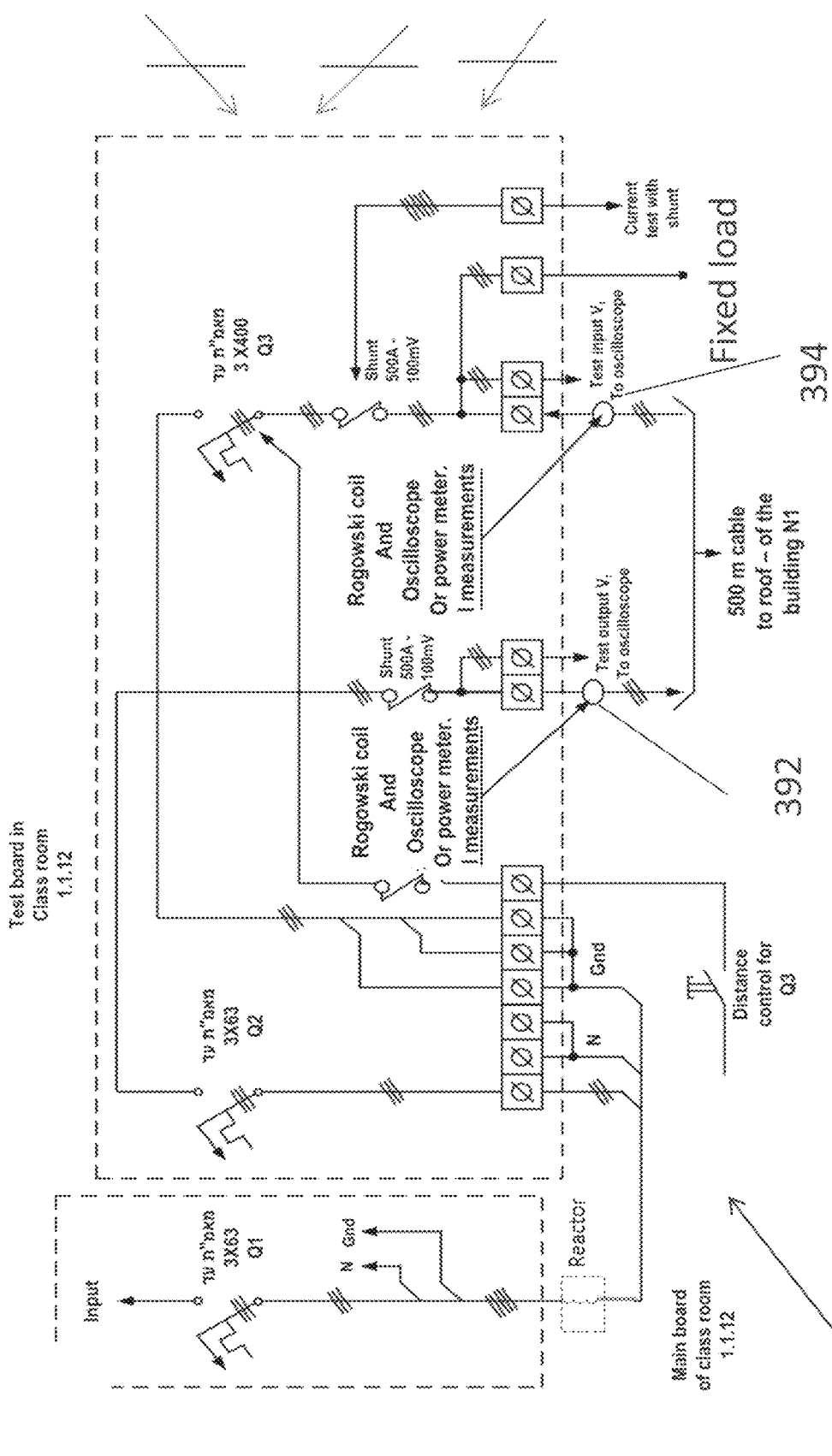
FIG. 39 is a schematic diagram of an experimental setup used to test the present embodiments to locate a short circuit on a 500 m cable.

Reference is now made to FIG. 39, which is a schematic diagram showing a three-phase circuit 390 with ballast resistance load with total power of 12 kW, 0.4 kV, which is connected at the end of a cable of 500 meters length. By using two oscilloscopes 392 and 394, the voltage at the beginning and end of the cable is measured and recorded. Using an oscilloscope connected to a shunt and Rogowski coils, a current though the cable is measured and recorded.

Measurements of the voltage at the beginning and the end of the cable, the current and the phase angle between the voltage and the current are obtained, i.e.: the instantaneous value of the voltage at the beginning and the end of the OHL, $u_{ph_1}(t)$ and $u_{ph_2}(t)$, the line current i(t), their RMS-values $U_{ph1}$, $U_{ph2}$, I and the phases between the current and the voltages at the line beginning and at the end, $\varphi_1(t)$ and $\varphi_2(t)$. These measured values allow us to determine the real cable parameters:

$$Z = |\dot{Z}| = \left|\frac{\dot{U}_{ph1} - \dot{U}_{ph2}}{\dot{I}}\right| \text{ or:}$$

$$R = \frac{Z}{\sqrt{1+(tg\varphi_2)}} \text{ and } X = Rtg\varphi_2.$$

When the designed or real geometrical length of the cable, $t_{line}$, is known the specific cable parameters can be determined as follows:

$$r_0 = R/l_{line} \text{ and } x_0 = X/l_{line} \cdot \Omega/\text{km}$$

Then, the real impedance of the cable may be calculated.

The results of measurements of the currents obtained by the shunt and Rogowski coils may be compared and the measurement error obtained by Rogowski coils in the steady state may be evaluated.

The short circuit experiment is carried out by turning off the load at the end of the cable and then connecting the scheme for carrying out the three-phase short-circuit experiment. The current at the beginning of a cable with a Rogowski coil may be measured. The oscilloscope may record the currents in one phase that is proportional to the voltage across the shunt and at the same time the phase voltage of 230 V at the beginning of the cable during the transition process until the instant that the short circuit-breaker trips. The obtained voltages and currents (for one phase) during the transition process are defined by the following expressions:

$$i_p = i_1 = \frac{U_{ma}}{Z_{S.C.}}\sin(\omega t + \alpha - \varphi_k) + i_{a(0)}e^{\frac{t}{T_a}} = i_{per} + i_{aper}$$

$$u_1(t) = U_m \sin(\omega t + \alpha - \varphi_U) + U_{a(0)}e^{\frac{t}{T_U}}$$

Figures 40, 41:
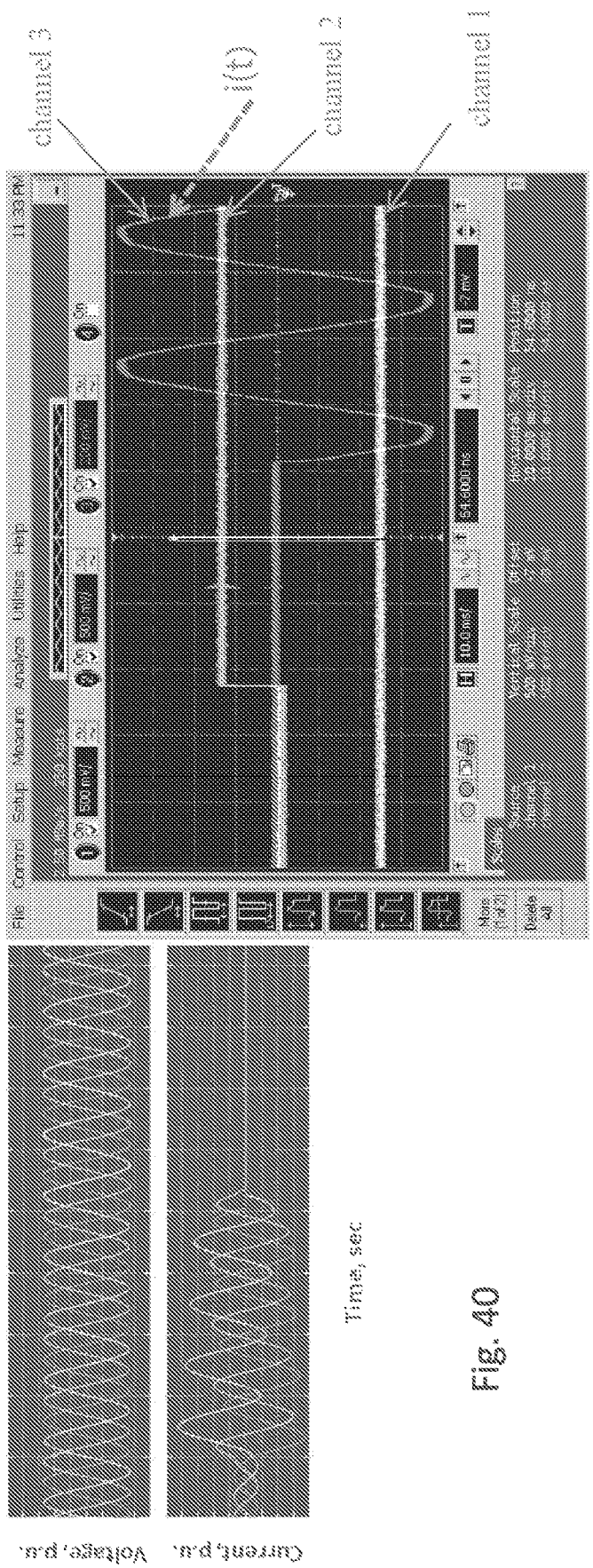
FIG. 40 is an oscillogram of current and voltage for a three-phase short circuit.
FIG. 41 is an oscillogram of single phase short circuit current at the end of the cable.

Some results of the recording on an oscilloscope of the appearance of a 3-phase short-circuit transient are shown in FIG. 40, which schematically shows oscillograms of current and voltage for a three-phase short-circuit.

Together with the oscillograms discrete databases may be obtained that allow necessary calculations on the basis of the above equations.

By using the present embodiments, the current and voltage modules of steady short-circuit current (sinusoidal component) and the free component parameters of the short-circuit current are determined:

$$T_a, i_{aper}(0), \alpha, \varphi_k, I_m T_U, U_{aper}(0), \alpha, \varphi_U, U_m$$

Then the value of the line impedance $Z_{s.c.}$ till the point of occurrence of the short-circuit is calculated as follows:

$$Z_{s.c.} = \frac{U_m}{I_m} = \sqrt{R_{s.c.}^2 + X_{s.c.}^2}.$$

Therefore, the distance to the point of short-circuit $l_{s.c.}$ may be determined by the expression:

$$l_{s.c.} = \frac{Z_{s.c.}}{\sqrt{r_0^2 + x_0^2}},$$

where $r_0$ and $x_0$ are defined before.
The measurement error we'll determine as following:

$$\Delta = \frac{l_{S.C.} - l_{cab}}{l_{cab}} \cdot 100\%$$

All parameters are calculated at different sampling rates of the original process: 96, 256, 512 and 1024 samples for the period voltage of 50 Hz (20 ms), i.e. the maximum sampling rate is 50 kHz. The comparison of the computing results allows for a determination of the best number of samples per period. In the experiment it was found to be 256 samples for a period of 50 Hz. Further increasing the number of samples reduces the accuracy of calculations but not by more than 0.02%.

To avoid interference between communications cables and the sensor and measuring devices, coaxial cables grounded at both ends are recommended. A variant uses a pure ground for digital oscilloscopes, voltage and current sensors.

Results.

An average statistical error in determining the distance to a short circuit point, which was calculated on the basis of the average of 30 measurements, does not exceed 1.1%.

Method #2.

Single phase short-circuit currents at the start of the cable line were obtained using a Rogowski coil. Measurements were obtained using an oscilloscope with a frequency of 1.2 GHz sampling rate. The same oscilloscope recorded results of measurements of the voltage across the current shunt.

Some measurement results are shown in the oscillogram of FIG. 41 of the single-phase short circuit current at the end of the cable.

Test results were be stored by the oscilloscope for further processing according to the method of the present embodiments. The method is based on measuring the time delay from the creation of the short until the time the pulse arrives at the measuring device. The measured time may be used to calculate the distance from $$l_{SC} = vt = ct/n,$$

where c is the velocity of light and n is the refraction index of dielectric media between the conductors carrying the phases. Since $l_{cab}$ is known (about 500 meters) one is able to calculate the accuracy of the method according to:

$$\Delta = \frac{l_{S.C.} - l_{cab}}{l_{cab}} \cdot 100\%$$

The current and voltage were measured by multiple devices including direct measurement by the oscilloscope using a voltage divider. The latter is possible in the case of a low voltage experiment as are current measurements using Rogowski coils. The coils are suitable for high voltage measurements but their response at high frequencies is uncertain. The derivatives of current and voltage are used, as in the above-described embodiments, to improve the accuracy of the timing measurements.

Additional Experimental System

Figure 42:
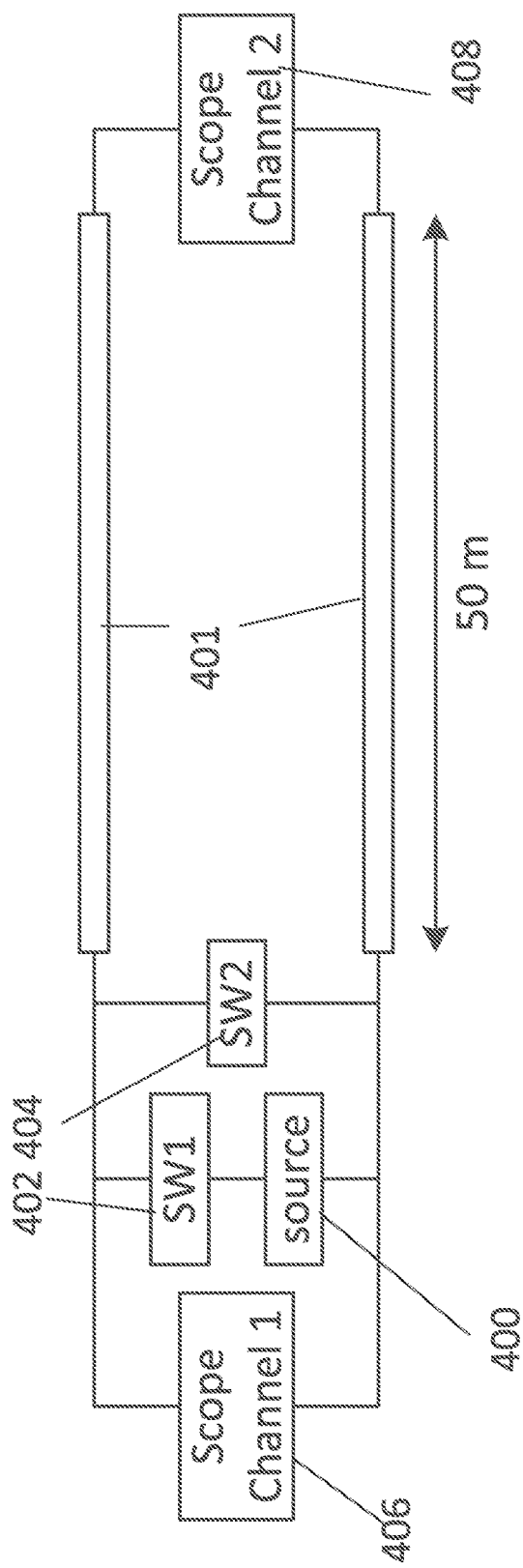
FIG. 42 illustrates an additional experimental arrangement according to embodiments of the present invention.

A further demonstration of the fault allocation technique involved the setup shown in FIG. 42 in which 10V DC is supplied from a TTi QL355TP power supply—source 400 to 50 m of two wire cable 401 and switches 402 and 404. The sensor in the demonstration is the MSO9404A Mixed Signal Oscilloscope of 4 GHz bandwidth having two channels 406 and 408. The system schematics is shown in FIG. 42.

Figure 43:
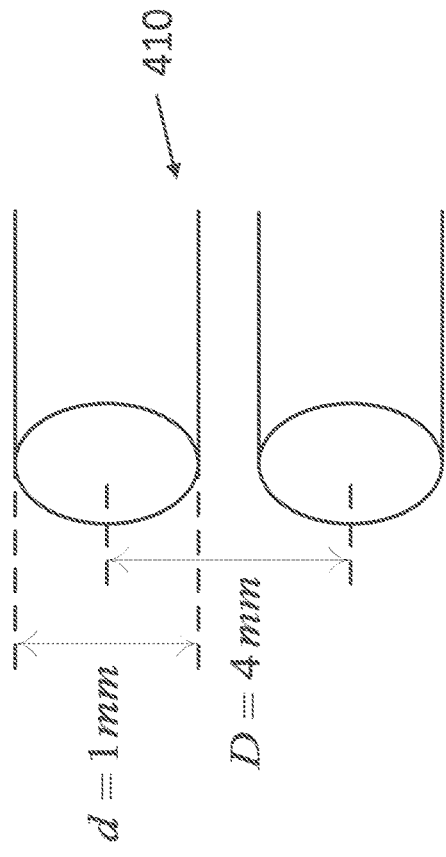
FIG. 43 is a detail of wires used in the arrangement of FIG. 42.

Reference is now made to FIG. 43, which illustrates the dimensions of the transmission line. The transmission line is a two-wire power cord 410. Each of the wire is made of copper of 1 mm diameter. These parameters enable us to calculate the inductance L and capacitance C as follows:

$$\varepsilon_{r(insulator)} = 3.45$$

$$\mu_{r(insulator)} = 1$$

$$\sigma_{copper} = 3 \cdot 10^6 \frac{S}{m}$$

$$C = \frac{2\pi\varepsilon}{\cosh^{-1}\left(\frac{D^2 - 2d^2}{2d^2}\right)} = 7.22 \cdot 10^{-11} \frac{F}{m}$$

$$L = \frac{\varepsilon\mu}{C} = 5.27 \cdot 10^{-7} \frac{H}{m}$$

Experiment Description

On the one side of the transmission line 401 we connected the DC source 400, 2 switches 402 and 404 and scope channel 406, another channel 408 is connected to the other side. Closing the first switch while the second switch is open we obtain a steady state DC voltage along the line. The short circuit fault experimental model is produced closing the second switch. Measuring both sides of the line we can see the delay that takes the signal to cross the line, reflected waves and so on (FIGS. 44 and 45).

Results and Data Processing

The data from the scope channels is exported and processed in MATLAB. Generally speaking, we are interested to find the time that takes the signal to arrive from the fault to the measuring point. Due to the fact that waves arriving at the edge are reflected in the opposite direction (to the fault) where they are reflected again and so forth, one fault may provide several time intervals, depending on how fast the transient signals decay. In the present case it was possible to measure 5 intervals each time, allowing a choice of the best reflection from the point of view of data extraction.

Figure 44:
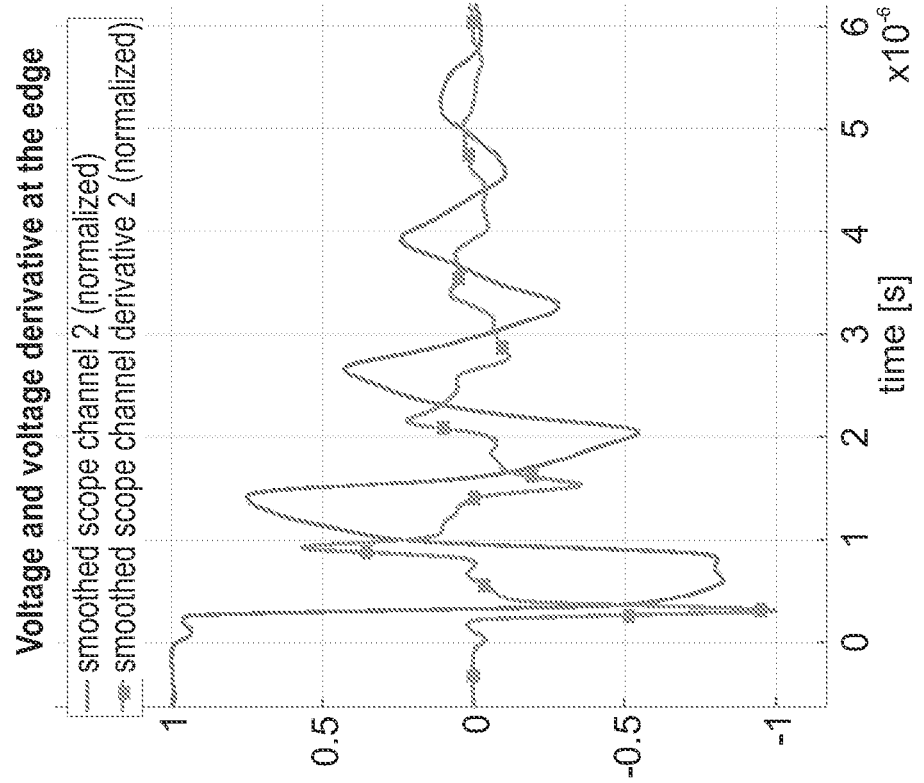
FIG. 44 is a graph showing voltage at the fault and edge using the arrangement of FIG. 42.
Figure 45:
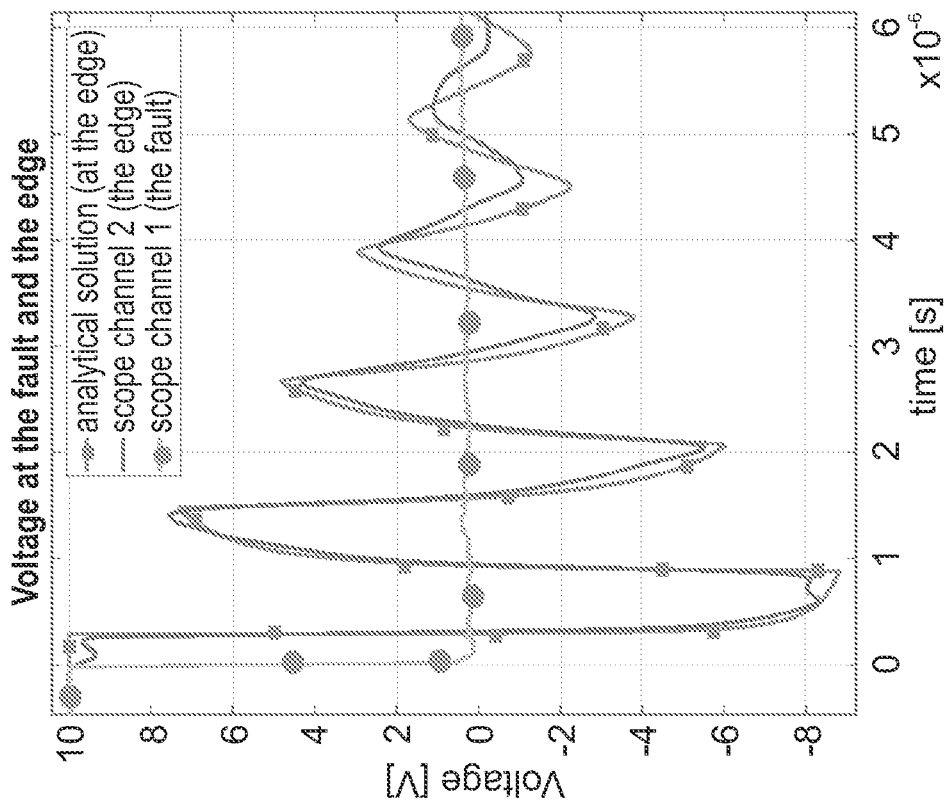
FIG. 45 is a graph showing the voltage and voltage derivative at the edge using the arrangement of FIG. 42 and illustrating the advantage of using the derivative.

Each peak in FIG. 44 thus represents the reflected wave (from the fault) arriving at the sensor. It can be seen from FIG. 45 that the voltage derivative peaks are much sharper, hence, the short circuit fault location is calculated by finding the time intervals between the local extremum points in the voltage derivative at the transmission line edge. In addition, it was noticed that the smoothing filter window may change the results a little bit, and the optimum configuration was found to be 200 points. In such case the accuracy in the short circuit fault location detection is ±0.005% using the second peak.

Conclusions and Summary

Propagation of a signal due to a short circuit fault in a two wired transmission line system shows that the short can be detected either by voltage or current measurements. By taking the voltage or current derivatives the short can be detected either on the source or the load side. In order to achieve high accuracy in determining the location of the short a sampling rate used should be in the order of a nanosecond, that is in the GHz frequency range.

Location of the fault using the present embodiments and a suitable sampling rate may provide accuracy levels in the range of tens of centimeters (hundreds of millimeters) and for example around 30 cm (300 mm).

It is noted that if there is no significant slope over a large number of samples (say 1000 samples), there is no need to save the individual sample results, and hence, the samples may be written as a moving window to a buffer register.

It is expected that during the life of a patent maturing from this application many relevant wave sampling techniques and devices will be developed and the scope of the corresponding terms are intended to include all such new technologies a priori.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment, and the above description is to be construed as if this combination were explicitly written. Conversely, various features of the invention, which are, for brevity, described in the context of a single embodiment, may also be provided separately or in any suitable sub combination or as suitable in any other described embodiment of the invention, and the above description is to be construed as if these separate embodiments were explicitly written. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. System for locating a fault on a line, the line having a first end and a second end and a first direction being from said first end to said second end, the system comprising:
   a first sampler configured to sample a pulse, the pulse emanating from a fault, the pulse being in a second direction opposite said first direction, the sampling being at a predetermined sampling rate;
   a differentiator configured to produce a differential of said sampled pulse;
   an analyzer configured to analyze said differential to obtain a timing, therefrom to determine a location of said fault.

2. The system of claim 1 further comprising a second sampler at said second end, configured to sample said pulse at said second end.

3. The system of claim 2, configured to find a location of said fault as a proportion based on half of a time taken by said pulse to arrive at said first sampler compared with a time taken by the pulse to arrive at said second sampler.

4. The system of claim 1, wherein said predetermined sampling rate is in the gigahertz range.

5. The system of claim 2, wherein a distance from said first end to said second end, d, is known, a distance $d_1$ from said first end to a fault is unknown and a distance from said fault to said second end, being $d_2=d-d_1$, is also unknown, a time of arrival of said pulse is $t_1$, a time of arrival of said pulse at said second end is $t_2$, and a propagation velocity of said pulse over said line v is known, the analyzer being configured to calculate $\Delta t=t_2-t_1$ and $d_1=\frac{1}{2}(d-v\Delta t)$ thereby to locate said fault.

6. The system of claim 1, wherein a distance from said first end to said second end, d, is known, a distance $d_1$ from said first end to a fault is unknown and a distance from said fault to said second end, being $d_2=d-d_1$, is also unknown, a time of arrival of said pulse is $t_1$ relating to distance $d_1$, a time of arrival of an echo of said pulse from said second end is $t_2$ relating to a distance $(d_1+2d_2)$, and a propagation velocity of said pulse over said line v is known, the analyzer being configured to locate said fault.

7. The system of claim 1, wherein a distance from said first end to said second end, d, is known, said fault being at said first end, a distance $d_1$ from said fault at said first end to said sensor is unknown, a distance $d_2$ from said sensor to said second end is known, a time of arrival of said pulse is $t_1$ relating to distance $d_1$, a time of arrival of a first echo of said pulse from said fault is $t_2$ relating to a distance $(d_1+2d_2)$, and a propagation velocity of said pulse over said line v is known, the analyzer being configured to locate said fault.

8. The system of claim 5, wherein said predetermined inter sampling duration is 2/v and said sampling rate is v/2.

9. The system of claim 1, wherein said first sampler is configured to sample one member of the group consisting of current and voltage.

10. The system of claim 1 wherein the line is one member of the group consisting of:
   an electrical transmission line, the fault being a short circuit;
   a transverse electromagnetic wave (TEM) transmission line;
   an optical line wherein the fault is a break in the optical line;
   a pipe, said pulse being an acoustic pulse and said fault being a break in the pipe.

11. The system of claim 1, wherein said first sampler is configured to obtain a plurality of successive samples.

12. The system of claim 11, wherein said plurality of successive samples are placed in a fixed size buffer with oldest samples being deleted to make way for new samples.

13. The system of claim 1 comprising a control center, the control center having links to a plurality of sources and a plurality of samplers on a plurality of lines.

14. Method for locating a fault on a line, the line having a first end and a second end and a first direction being from said first end to said second end, the method comprising:
   sampling a pulse, in a second direction opposite said first direction, the pulse issuing from said fault, the sampling being at a predetermined sampling rate;
   obtaining a differential of said sampled pulse;
   analyzing said differential to obtain a timing, therefrom to determine a location of said fault.

15. The method of claim 14, further comprising sampling said pulse at said second end.

16. The method of claim 15, further comprising finding a location of said fault as a proportion based on half of a time taken by said pulse to arrive at said first end compared with a time taken by the pulse to arrive at said second end.

17. The method of claim 15, wherein a distance from said first end to said second end, d, is known, a distance $d_1$ from said first end to a fault is unknown, a distance from said fault to said second end is $d-d_1$ and also is unknown, a time of arrival of said reflection is $t_1$, a time of arrival at said pulse at said second end is $t_2$, and a propagation velocity of said pulse over said line, v, is known, the analyzer being configured to calculate $\Delta t = t_2 - t_1$ and $d_1 = \frac{1}{2}(d - v\Delta t)$ thereby to locate said fault.

18. The method of claim 14, wherein a distance from said first end to said second end, d, is known, a distance $d_1$ from said first end to a fault is unknown and a distance from said fault to said second end, being $d_2 = d - d_1$, is also unknown, a time of arrival of said pulse is $t_1$ relating to distance $d_1$, a time of arrival of an echo of said pulse from said second end is $t_2$ relating to a distance $(d_1 + 2d_2)$, and a propagation velocity of said pulse over said line v is known, the method thereby locating said fault.

19. The method of claim 14, wherein a distance from said first end to said second end, d, is known, a distance $d_1$ from a fault at said first end to said sensor is unknown, and a distance $d_2$ from said sensor to said second end is known, a time of arrival of said pulse is $t_1$ relating to distance $d_1$, a time of arrival of a first echo of said pulse from said fault is $t_2$ relating to a distance $(d_1 + 2d_2)$, and a propagation velocity of said pulse over said line v is known, the method thereby locating said fault.

20. The method of claim 14, wherein a predetermined inter-sampling duration is 2/v and said sampling rate is v/2.

21. The method of claim 14, wherein the line is one member of the group consisting of:
   an electrical transmission line and the fault comprises a short circuit;
   an optical line and the fault is a break in the optical line;
   a pipe, said pulse being an acoustic pulse and said fault being a break in the pipe.

22. The method of claim 14, comprising sampling one member of the group consisting of current and voltage.

23. The method of claim 14, comprising controlling a plurality of lines from a control center, by sending pulses and sampling on any of said lines where a fault needs to be identified.

* * * * *